US012593451B2

(12) United States Patent
Zhu

(10) Patent No.: US 12,593,451 B2
(45) Date of Patent: Mar. 31, 2026

(54) MEMORY DEVICE, METHOD OF MANUFACTURING MEMORY DEVICE, AND ELECTRONIC DEVICE INCLUDING MEMORY DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 378 days.

(21) Appl. No.: 18/547,391

(22) PCT Filed: Apr. 3, 2023

(86) PCT No.: PCT/CN2023/085913
§ 371 (c)(1),
(2) Date: Aug. 22, 2023

(87) PCT Pub. No.: WO2024/174345
PCT Pub. Date: Aug. 29, 2024

(65) Prior Publication Data
US 2024/0292618 A1      Aug. 29, 2024

(30) Foreign Application Priority Data
Feb. 24, 2023      (CN) ......................... 202310190808.X

(51) Int. Cl.
*H10B 43/27*       (2023.01)
*H10B 51/20*       (2023.01)

(52) U.S. Cl.
CPC ............. *H10B 43/27* (2023.02); *H10B 51/20* (2023.02)

(58) Field of Classification Search
CPC ................................ H10B 43/27; H10B 51/20
See application file for complete search history.

(56) References Cited

U.S. PATENT DOCUMENTS

| | | | | |
|---|---|---|---|---|
| 9,324,419 B2 * | 4/2016 | Pang | ...................... | G11C 16/10 |
| 2017/0179027 A1 * | 6/2017 | Kim | ...................... | H10B 43/40 |

(Continued)

FOREIGN PATENT DOCUMENTS

| | | |
|---|---|---|
| CN | 109003982 A | 12/2018 |
| CN | 109830483 A | 5/2019 |

(Continued)

OTHER PUBLICATIONS

CN110767656A 3D storage device and manufacturing method thereof, 13 pages (Year: 2025).*

*Primary Examiner* — Tuyen K Vo
(74) *Attorney, Agent, or Firm* — Westman, Champlin & Koehler, P.A.

(57) ABSTRACT

Disclosed are a memory device, a method of manufacturing the memory device, and an electronic device. The memory device may include: a plurality of first device layers, each including first and second source/drain regions and a channel region; a plurality of second device layers stacked on the first device layers, each including third and fourth source/drain regions and a channel region; and a gate stack extending vertically to pass through the first and second device layers. The gate stack includes a gate conductor layer and a memory functional layer disposed between the gate conductor layer and each device layer, and a memory cell is defined at an intersection of the gate stack and each device layer. The gate stack has a surface in a bended shape at a position where (Continued)

the plurality of first device layers are adjacent to the plurality of second device layers.

35 Claims, 20 Drawing Sheets

(56)                    References Cited

U.S. PATENT DOCUMENTS

| | | | | |
|---|---|---|---|---|
| 2020/0035696 A1* | 1/2020 | Zhu | ........................ | H10B 43/50 |
| 2021/0375928 A1* | 12/2021 | Wu | ........................ | H10D 99/00 |
| 2023/0301210 A1* | 9/2023 | Chang | .................. | H10N 70/826 |
| | | | | 257/4 |
| 2024/0206194 A1* | 6/2024 | Or-Bach | ................ | H10B 43/20 |
| 2025/0098167 A1* | 3/2025 | Oh | ........................ | H10B 41/27 |

FOREIGN PATENT DOCUMENTS

| | | | |
|---|---|---|---|
| CN | 109904169 A | 6/2019 |
| CN | 110767656 A | 2/2020 |

* cited by examiner

Cell region ◄─────►  Contact region

1011

1017
1015

1009₂
1007₂
1005₂
1003₂
1009₁
1007₁
1005₁
1003₁

1001

A                                                        A'

1011

1019

1021

1015

1009₂
1007₂
1005₂

1009₁
1007₁
1005₁

1001

A                                                        A'

MEMORY DEVICE, METHOD OF MANUFACTURING MEMORY DEVICE, AND ELECTRONIC DEVICE INCLUDING MEMORY DEVICE

CROSS REFERENCE TO RELATED APPLICATION(S)

This application is a Section 371 National Stage Application of International Application No. PCT/CN2023/085913, filed on Apr. 3, 2023, which claims priority to Chinese Patent Application No. 202310190808.X, filed on Feb. 24, 2023, entitled "MEMORY DEVICE, METHOD OF MANUFACTURING MEMORY DEVICE, AND ELECTRONIC DEVICE INCLUDING MEMORY DEVICE", the contents of which are incorporated herein by reference in their entireties.

TECHNICAL FIELD

The present disclosure relates to a field of semiconductor, in particular to a memory device, a method of manufacturing the memory device and an electronic device including the memory device.

BACKGROUND

In a horizontal device such as a Metal Oxide Semiconductor Field Effect Transistor (MOSFET), a source, a gate and a drain are arranged in a direction substantially parallel to a surface of a substrate. Due to such an arrangement, the horizontal device is difficult to further scaled down. In contrast, in a vertical device, a source, a gate and a drain are arranged in a direction substantially perpendicular to a surface of a substrate. As a result, the vertical device is easier to be scaled down compared to the horizontal device. Moreover, the vertical device is easy to be stacked, so as to be suitable for obtaining a three-dimensional (3D) structure.

A memory capacity of the memory device may be increased by stacking a plurality of memory cell arrays. However, as a number of stacked layers increases, a performance of the device deteriorates. For example, polycrystalline silicon is usually used as a channel material, resulting in a greater resistance compared with using single crystal silicon as the channel material. In addition, it is difficult to etch a hole having a large aspect ratio (e.g. >about 40 to 80), or a maximum depth of the etched hole is limited (e.g. <about 4 to 8 μm). This limits an increasing of the number of stacked layers.

SUMMARY

In view of the above, the purpose of the present disclosure is at least partially to provide a memory device with improved performance, a method of manufacturing the memory device, and an electronic device including the memory device.

According to an aspect of the present disclosure, a memory device is provided, including: a plurality of first device layers vertically stacked on a substrate, where each first device layer includes a first source/drain region disposed at a lower vertical height in the first device layer, a second source/drain region disposed at an upper vertical height in the first device layer, and a channel region between the first source/drain region and the second source/drain region: a plurality of second device layers vertically stacked on the plurality of first device layers, where each second device layer includes a third source/drain region disposed at a lower vertical height in the second device layer, a fourth source/drain region disposed at an upper vertical height in the second device layer, and a channel region between the third source/drain region and the fourth source/drain region; and a gate stack extending vertically relative to the substrate to pass through the plurality of first device layers and the plurality of second device layers on the substrate, where the gate stack includes a gate conductor layer and a memory functional layer disposed between the gate conductor layer and each device layer of the plurality of first device layers and the plurality of second device layers, and a memory cell is defined at an intersection of the gate stack and each device layer, where the gate stack has a surface in a bended shape at a position where the plurality of first device layers are adjacent to the plurality of second device layers.

According to another aspect of the present disclosure, a method of manufacturing a memory device is provided, including: disposing a first stack of a plurality of first device layers and a plurality of first sacrificial layers on a substrate, where each first device layer has a first sacrificial layer on at least a side of the first device layer: forming a first processing channel extending vertically relative to the substrate to pass through the first stack based on a mask: growing a seed layer continuously extending on the first stack by taking an uppermost first device layer in the first stack as a seed: disposing a second stack of a plurality of second device layers and a plurality of second sacrificial layers on the seed layer, where each second device layer has a second sacrificial layer on at least a side of the second device layer; forming a second processing channel extending vertically relative to the substrate to pass through the second stack based on the mask, where the second processing channel communicates with the first processing channel: removing the first sacrificial layer through the first processing channel and removing the second sacrificial layer through the second processing channel: forming a first isolation layer in a space released due to a removal of the first sacrificial layer through the first processing channel; and forming a second isolation layer in a space released due to a removal of the second sacrificial layer through the second processing channel; and forming a first gate stack in the first processing channel, where the first gate stack includes a first gate conductor layer and a first memory functional layer disposed between the first gate conductor layer and the first device layer; and forming a second gate stack in the second processing channel, where the second gate stack includes a second gate conductor layer and a second memory functional layer disposed between the second gate conductor layer and the second device layer.

According to another aspect of the present disclosure, an electronic device is provided, including the aforementioned memory device.

According to embodiments of the present disclosure, the memory device may include a stack of first device layer and a stack of second device layer. The gate stack may extend vertically to pass through respective stacks which are stacked. An extending portion of the gate stack in each stack may be formed in a processing channel or a hole passing through the stack. Corresponding processing channels or corresponding holes in different stacks may be formed separately. Therefore, a depth of each processing channel or a depth of each hole may correspond to a thickness of a corresponding stack, rather than a total thickness of all device layers in the memory device. Therefore, it is possible to reduce a difficulty of etching and/or a difficulty of filling the processing channels or the holes used to form and accommodate the gate stack. A conductive metal layer may be provided and configured for a bit line connection or a source line connection, so as to reduce a resistance. In addition, a stack of single crystal material may be configured as a building block to build a three-dimensional (3D) memory device. Therefore, when a plurality of memory cells are stacked, an increase in resistance may be suppressed.

BRIEF DESCRIPTION OF THE DRAWINGS

The above and other purposes, features, and advantages of the present disclosure will be more clearly described through the following description of embodiments of the present disclosure with reference to the accompanying drawings, in which.

Throughout the accompanying drawings, the same or similar reference numerals indicate the same or similar components.

DETAILED DESCRIPTION OF EMBODIMENTS

Figure 1:
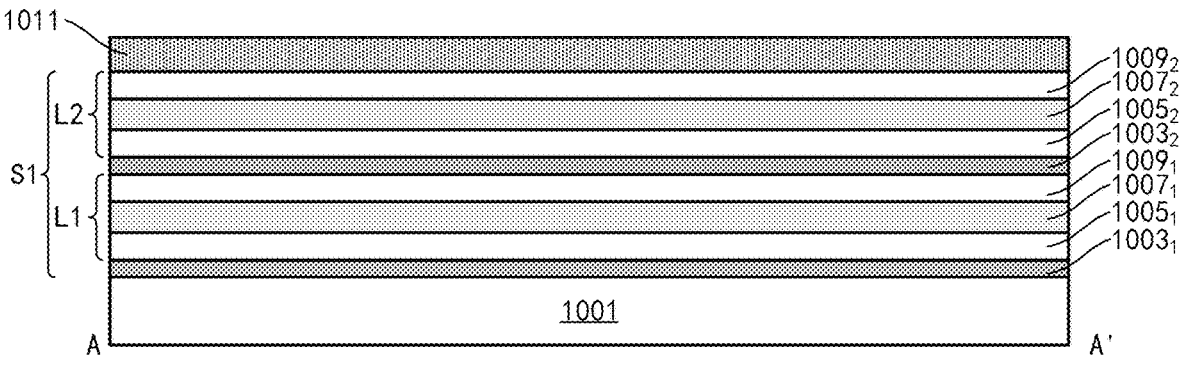
FIGS. 1 to 16 (*c*) show schematic diagrams of some stages in a process of manufacturing a memory device according to an embodiment of the present disclosure.

Hereinafter, embodiments of the present disclosure will be described with reference to accompanying drawings. However, it should be understood that these descriptions are only illustrative and are not intended to limit the scope of the present disclosure. In addition, in the following explanation, descriptions of well-known structures and techniques are omitted to avoid unnecessarily confusing concepts of the present disclosure.

Various structural schematic diagrams according to embodiments of the present disclosure are shown in the accompanying drawings. These diagrams are not drawn to scale, and for the purpose of clarity, certain details are enlarged and possibly omitted. The shapes of various regions and layers shown in the figures, and their relative sizes and positional relationships are only exemplary. In practice, there may be deviations due to manufacturing tolerances or technical limitations. Additionally, those skilled in the art may additionally design regions/layers with different shapes, size and relative positions as desired in practice.

In the context of the present disclosure, when a layer/component is referred to as being located "on" another layer/component, the layer/component may be directly located on the another layer/component, or there may be a middle layer/component between them. In addition, if a layer/component is located "on" another layer/component in a certain orientation, when the orientation is reversed, the layer/component may be located "below" the another layer/component.

The memory device according to embodiments of the present disclosure is based on a vertical device. The vertical device may include an active region disposed on a substrate in a vertical direction (a direction substantially perpendicular to a surface of the substrate), including source/drain regions disposed at different vertical heights (such as respectively disposed at an upper end and a lower end), and a channel region disposed between the source/drain regions. A conductive channel may be formed between the source/drain regions through the channel region. In the active region, the source/drain regions and the channel region may be defined, for example, by doping concentration.

According to embodiments of the present disclosure, the active region may be defined by a device layer on the substrate. For example, the device layer may be a semiconductor material layer, the source/drain regions may be respectively formed at opposite ends of the semiconductor material layer in the vertical direction through doping (such as in situ doping below), and the channel region may be formed in the middle of the semiconductor material layer in the vertical direction. Alternatively, the device layer may be a stack of a source/drain layer, a channel layer and a source/drain layer. The source/drain layer may be performed in situ doping during growth to form a source/drain region. A gate stack may extend through the device layer, so as to allow the active region to surround a periphery of the gate stack. Here, the gate stack may include a memory functional layer, such as at least one of a charge trapping material or a ferroelectric material, so as to achieve a memory function. In this way, the gate stack is cooperated with the active region opposite to the gate stack, so as to define a memory cell. Here, the memory cell may be a flash memory cell.

A plurality of gate stacks may be disposed to pass through the device layer, thereby defining a plurality of memory cells at intersections of the plurality of gate stacks and the device layer. Such memory cells are arranged in an array (for example, usually a two-dimensional array arranged in rows and columns) corresponding to the plurality of gate stacks in a plane, in which the device layer is located.

Since the vertical device is easy to be stacked, the memory device according to embodiments of the present disclosure may be a three-dimensional (3D) array. Specifically, a plurality of such device layers may be provided in the vertical direction. The gate stack may extend vertically to pass through the plurality of device layers. In this way, for a single gate stack, the single gate stack intersects with the plurality of device layers stacked in the vertical direction to define a plurality of memory cells stacked in the vertical direction.

A capacity of the memory device is desired to be increased, so that a number of device layers vertically stacked may be large. According to embodiments of the present disclosure, the memory device may include several stacks, and each stack is provided with a plurality of device layers. The gate stack may extend vertically to pass through respective stacks which are staked. An extending portion of the gate stack in each stacks may be formed in a processing channel or a hole passing through the stack. Corresponding processing channels or corresponding holes in different stacks may be formed separately. Therefore, a depth of each processing channel or a depth of each hole may correspond to a thickness of a corresponding stack, rather than a total thickness of all device layers in the memory device. Therefore, it is possible to reduce a difficulty of etching and/or a difficulty of filling the processing channels or the holes used to form and accommodate the gate stack.

Processing channels or the holes in various stacks may not be aligned due to being formed separately. Therefore, the gate stack may have a bended shape corresponding to such misalignment. Corresponding to the number of the stacks which are stacked, the gate stack may have a plurality of bended shapes.

The gate stack may include a first portion adjacent to a bend and below the bend, a second portion adjacent to the bend and above the bend, and a connection portion corresponding to the bend between the first portion and the second portion. The connection portion may have a reduced width relative to the first portion (especially, a top of the first portion) and the second portion (especially, a bottom of the second portion), so as to form the bended shape. It is noted that the first portion, the second portion and the connection portion are merely geometric divisions and do not necessarily mean that these portions are physically separated from each other. For example, the first portion, the second portion and the connection portion may be integral, or the first portion, the second portion and the connection portion may be formed separately to include portions separated from each other.

The memory device according to embodiments of the present disclosure may have a NOR ("NOT OR") configuration or an AND ("AND") configuration. In a NOR-type memory device, each memory cell may be connected to a common source line. In view of such configuration, every two adjacent memory cells in the vertical direction may be connected by sharing a same source line, so as to save wirings. For example, for the two adjacent memory cells, respective source/drain regions of the two adjacent memory cells located at a near end (i.e., an end of which the two memory cells are close to each other) may be configured as a source region, and thus, for example, are electrically connected to a source line through a common contact portion. Respective source/drain regions of the two adjacent memory cells located at a far end (i.e., an end of which the two memory cells are away from each other) may be configured as a drain region and may be respectively connected to different bit lines.

The device layer may be formed through epitaxial growth. The device layer may be a single crystal semiconductor material. Compared to a conventional process of forming the plurality of stacked gates which are stacked and then forming a vertical active region passing through these gate stacks, it is easier to form a single crystal active region (especially, a channel region). In addition, the in situ doping may be performed during growth, so as to form a doping distribution in the vertical direction in the device layer. A doping concentration interface may be provided between different doped portions. The device layer may form a bulk material, and thus the channel region is formed within the bulk material. In this case, the process is relatively simple.

The device layer may be provided with a conductive metal layer on at least one of a lower surface of the device layer and an upper surface of the device layer, which is beneficial to reduce resistance. In a case that the lower surface of the device layer and the upper surface of the device layer are provided with conductive metal layers, one of which may be configured as a bit line (BL) connection and the other one of the conductive metal layers may be configured as a source line (SL) connection. Alternatively, in a case that a conductive metal layer is provided on one of the lower surface of the device layer and the upper surface of the device layer (while no conductive metal layer is provided on the other surface), the conductive metal layer may be configured as the BL connection or the SL connection.

Such vertical memory device may be manufactured, for example, as follows. Specifically, a first stack of a plurality of first device layers and a plurality of first sacrificial layers may be disposed on a substrate, so that each first device layer has a first sacrificial layer on at least a side (an upper side and/or a lower side) of each first device layer. For example, the first device layer and the first sacrificial layer may be alternately disposed, or the first sacrificial layer may be disposed between every two first device layers. The first device layer and the first sacrificial layer may be provided through epitaxial growth. The first sacrificial layer may be replaced by an isolation layer (especially, a structure in which the isolation layer is sandwiched by the conductive metal layers). In addition, during epitaxial growth, the in situ doping may be performed, so as to achieve a doping polarity and a doping concentration as required. A first processing channel that extends vertically relative to the substrate to pass through the first stack may be formed.

On the first stack, a second layer may be similarly formed. For forming the single crystal, an uppermost first device layer in the first stack (especially, a top surface of the uppermost first device layer and part of a sidewall of the uppermost first device layer exposed in the first processing channel) may be taken as a seed to grow a seed layer. Although the uppermost first device layer which is taken as the seed has a hole at the first processing channel, portions which are grown around the hole may be bonded to each other, so that the seed layer may continuously extend on the first processing channel. A second stack of a plurality of second device layers and a plurality of second sacrificial layers may be disposed on the seed layer, so that each second device layer has a second sacrificial layer on at least a side (an upper side and/or a lower side) of each second device layer. The second stack may have substantially the same or similar configuration as the first stack.

A second processing channel which extends vertically relative to the substrate to pass through the second stack and communicates with the first processing channel may be formed. The first processing channel and the second processing channel may be formed based on the same mask. However, there may be a complete misalignment between a lithography process of forming the first processing channel and a lithography process of forming the second processing channel, such as an existence of offset errors, which may lead to the bended shape as described above.

In the first processing channel, a sidewall of the first sacrificial layer may be exposed, so that the first sacrificial layer may be replaced by a structure in which a first isolation layer is sandwiched by first conductive metal layers (for convenience, it may be referred to as "first replacement process"). Similarly, in the second processing channel, a sidewall of the second sacrificial layer may be exposed, so that the second sacrificial layer may be replaced by a structure in which a second isolation layer is sandwiched by second conductive metal layers (for convenience, it may be referred to as "second replacement process").

The first replacement process may be performed after the first processing channel is formed (and before the seed layer is grown to close a top of the first processing channel). The second replacement process may be performed after the second processing channel is formed. Alternatively, the first replacement process and the second replacement process may be performed using the same process after the first processing channel and the second processing channel which communicate with each other are formed. In this case, the first conductive metal layer and the second conductive metal layer may include the same conductive metal layer, and the first isolation layer and the second isolation layer may include the same isolation layer. This provides different process options.

The first replacement process and the second replacement process may be performed, for example, as follows. A support layer may be formed in one or more of the processing channels (such as the first processing channel, or the second processing channel, or the first processing channel and the second processing channel communicating with each other), so as to support the stack when replacing (the first and/or the second) the sacrificial layer. The sacrificial layer may be removed, for example, by selectively etching, through the rest of processing channels. In a space released due to a removal of the sacrificial layer, a conductive metal layer and an isolation layer may be formed, for example, by depositing followed by etching back.

In the first processing channel, a first gate stack may be formed (for convenience, it may be referred to as "first gate stack formation process"). Similarly, in the second processing channel, a second gate stack may be formed (for convenience, it may be referred to as "second gate stack formation process").

The first gate stack formation process may be performed after the first processing channel is formed (and before the seed layer is formed to close the top of the first processing channel). The second gate stack formation process may be performed after the second processing channel is formed. Alternatively, the first replacement process and the second replacement process may be performed using the same process after the first processing channel and the second processing channel communicating with each other are formed. In this case, a first memory functional layer in the first gate stack and a second memory functional layer in the second gate stack may include the same memory functional layer, and a first gate conductor layer in the first gate stack and a second gate conductor layer in the second gate stack may include the same gate conductor layer. This provides different process options.

The present disclosure may be presented in various forms, and some examples will be described below. In the following description, a selection of various materials is involved. In addition to considering functions (for example, semiconductor materials are used to form active regions, dielectric materials are used to form electrical isolation, conductive materials are used to form electrodes and interconnection structures, etc.), etching selectivity is also considered in the selection of materials. In the following description, the required etching selectivity may or may not be indicated. It should be clear to those skilled in the art that, when it is mentioned below that a certain material layer is etched, if it is not mentioned that other layers are also etched or it is not shown in the figures that other layers are also etched, such etching may be selective and the material layer may have etching selectivity relative to other layers exposed in the same etching recipe.

FIGS. 1 to 16(c) show schematic diagrams of some stages in a process of manufacturing a memory device according to an embodiment of the present disclosure.

As shown in FIG. 1, a substrate 1001 is provided. The substrate 1001 may be various forms of substrates, including but not limited to a bulk semiconductor material substrate such as a bulk Si substrate, a semiconductor on insulator (SOI) substrate, a compound semiconductor substrate such as SiGe substrate, etc. In the following description, for the convenience of explanation, the bulk Si substrate such as Si chip is taken as an example for description.

On the substrate 1001, a memory device, such as a NOR-type flash memory or an AND-type flash memory, may be formed as follows. A memory cell (cell) in the memory device may be an n-type device or a p-type device. Here, an n-type memory cell is taken as an example for description, for which a p-type well may be formed in the substrate 1001. Therefore, the following description, especially regarding doping types, is directed to a formation of the n-type device. However, this disclosure is not limited thereto.

On the substrate 1001, a sacrificial layer $1003_1$ for defining an isolation layer, a first source/drain layer $1005_1$ for defining a source/drain region, a channel layer $1007_1$ for defining a channel region, and a second source/drain layer $1009_1$ for defining the source/drain region may be formed, for example, through epitaxial growth. A growth temperature, for example, may be about 600° C. to about 700° C. The first source/drain layer $1005_1$, the channel layer $1007_1$ and the second source/drain layer $1009_1$ will then define an active region of the device, which may be referred to as "device layer", denoted as L1 in the figure.

The layers grown on the substrate 1001 may be single crystal semiconductor layers. These layers may have crystal interfaces or doping concentration interfaces due to respective growth or doping.

The sacrificial layer $1003_1$ may be replaced by an isolation layer used to isolate the device from the substrate. A thickness of the sacrificial layer $1003_1$ may correspond to a thickness of the isolation layer as desired, for example, about 10 nm to 50 nm. According to a circuit design, the sacrificial layer $1003_1$ may be omitted. The first source/drain layer $1005_1$ and the second source/drain layer $1009_1$ may form a source/drain region by doping (for example, in situ doping during growth). A thickness of the source/drain region is about 20 nm to 50 nm. The channel layer $1007_1$ may define a gate length, and a thickness of the channel layer $1007_1$ may correspond to a gate length as desired, for example, about 15 nm to 200 nm.

Such semiconductor layers may include various suitable semiconductor materials, such as elemental semiconductor materials such as Si or Ge, compound semiconductor materials such as SiGe, etc. Considering a process of replacing the sacrificial layer $1003_1$ by an isolation layer, the sacrificial layer $1003_1$ may have etching selectivity relative to the device layer. For example, the sacrificial layer $1003_1$ may include SiGe (an atomic percentage of Ge is about 15% to 30%), and the device layer may include Si. In this example, the source/drain layer in the device layer and the channel layer in the device layer include Si, but the present disclosure is not limited thereto. For example, adjacent layers in the device layer may also have etching selectivity.

When growing the first source/drain layer $1005_1$ and the second source/drain layer $1009_1$, the first source/drain layer $1005_1$ and the second source/drain layer $1009_1$ may be performed in situ doping, so as to subsequently form a source/drain region. For example, for the n-type device, n-type doping may be performed, and a doping concentration may be about $1E19$ cm$^{-3}$ to $1E21$ cm$^{-3}$. In addition, the channel layer $1007_1$ may not be intentionally doped or may be lightly doped by in situ doping during growth, so as to improve a short channel effect, adjust a threshold voltage (Vt) of the device, and the like. For example, for the n-type device, p-type doping may be performed, and a doping concentration may be about $1E17$ $cm^{-3}$ to $1E19$ $cm^{-3}$. In addition, in the vertical direction, the doping concentration in the channel layer $1007_1$ may have a non-uniform distribution, so as to optimize device performance. For example, the concentration in a region close to the drain region (for example, subsequently connected to a bit line) is relatively high to reduce the short channel effect, while the concentration in a region close to the source region (for example, subsequently connected to a source line) is relatively low to reduce channel resistance or optimize hot carrier injection to facilitate tunneling. It is possible to be achieved by introducing different doses of dopants at different stages of growth.

Although the device layer L1 is described here as including three layers formed separately (the first source/drain layer $1005_1$, the channel layer $1007_1$, and the second source/drain layer $1009_1$), the present disclosure is not limited thereto. For example, the device layer L1 may be a single layer, but the source/drain region and the channel region are defined by introducing different doses of dopants at different stages of growth.

In order to increase an integration density, a plurality of device layers may be disposed. For example, the device layer L2 may be disposed on the device layer L1 by epitaxial growth, and the device layers are separated by the sacrificial layer $1003_2$ used to define the isolation layer. Although only two device layers are shown in FIG. 1, the present disclosure is not limited thereto. According to the circuit design, some device layers may not be provided with isolation layers. Similarly, the device layer L2 may have a first source/drain layer $1005_2$, a channel layer $1007_2$ and a second source/drain layer $1009_2$. Corresponding layers in each device layer may have the same or similar thickness and/or material, or may have different thicknesses and/or materials. Here, for convenience of description, it is assumed that the device layer L1 and the device layer L2 have the same configuration.

According to embodiments of the present disclosure, in order to facilitate the manufacturing, especially to facilitate the etching of the processing channel or the hole, a number of layers of the device layer etched together to form the processing channel or the hole therein may be about 10 to 200 (two layers L1 and L2 are schematically shown in FIG. 1), so that a total thickness of a first stack S1 (including corresponding isolation layers) formed by the two layers may be, for example, about 2 μm to 10 μm. A maximum value of the total thickness of the first stack S1 may be determined according to a process capability, for example, an aspect ratio that may be achieved by the etching process used to etch the processing channel or the hole, and a backfill capability/uniformity, etc. of a deposition process of depositing material in a gap in the stack (such as, a gap released due to a removal of the sacrificial layer). For example, in a case that the processing channel or the hole has a predetermined lateral dimension such as a diameter, the total thickness of the first stack S1 (substantially equal to a depth of the processing channel or the hole) may be controlled, so that the aspect ratio of the processing channel or the hole (~ the total thickness of the first stack S1/the diameter of the processing channel or the hole) is smaller than, for example, about 40 to 80, thereby facilitating etching.

On the first stack S1, a hard mask layer 1011 may be disposed, so as to facilitate patterning. For example, the hard mask layer 1011 may include a nitride (such as silicon nitride) with a thickness of about 50 nm to 200 nm.

In the following, on the one hand, it is required to have a processing channel that may reach the sacrificial layer, so as to replace the sacrificial layer by the isolation layer. On the other hand, it is required to define a region used to form a gate. According to embodiments of the present disclosure, the two may be combined. Specifically, a gate region may be defined using the processing channel.

Figure 2A:
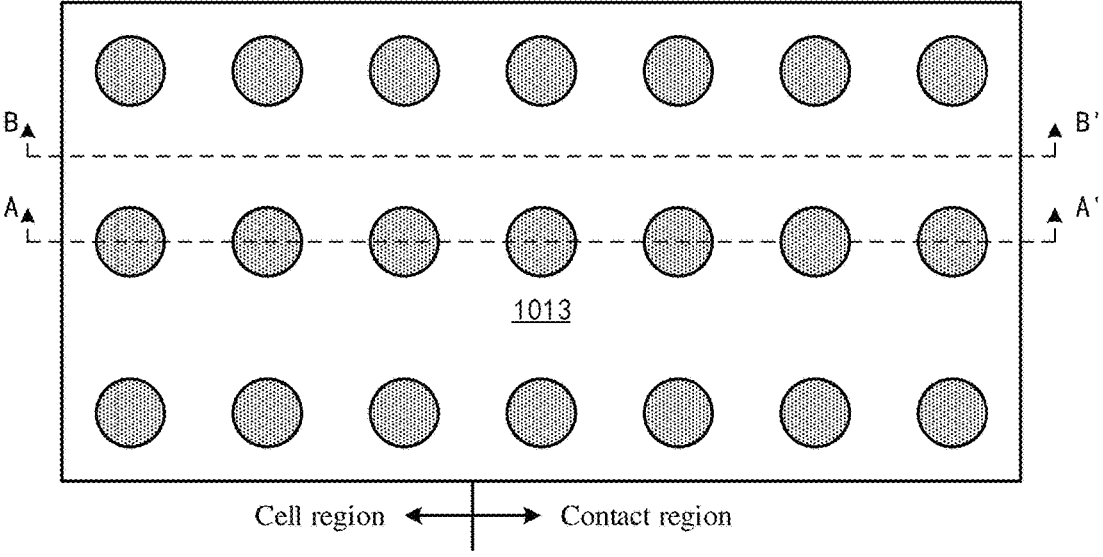
Figure 2B:
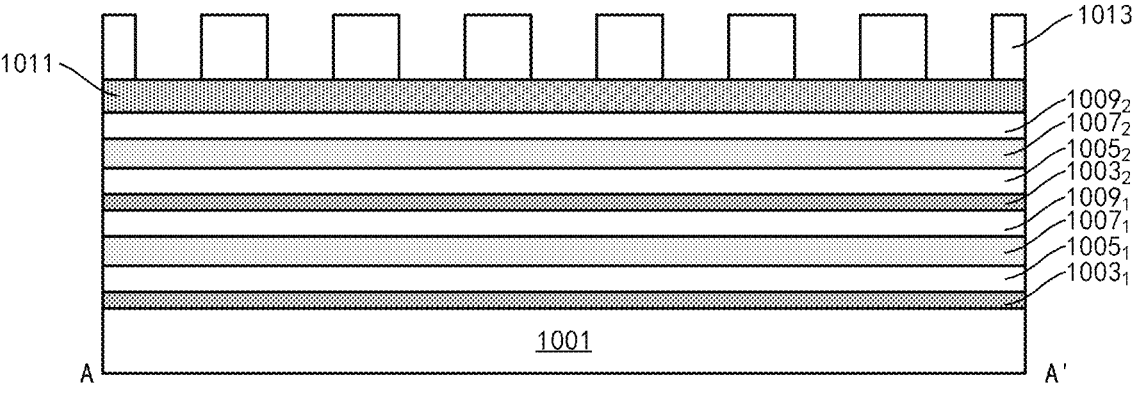

For example, as shown in FIGS. 2(a) and 2(b), a photoresist 1013 may be formed on the hard mask layer 1011 and patterned by photolithography to have a series of openings that may define a position of the processing channel. The openings may be in various suitable shapes, such as circular, rectangular, square, polygonal, etc., and have suitable sizes, such as a diameter or a side length of about 20 nm to 500 nm. Here, these openings (especially in a cell region) may be arranged in an array form, such as a two-dimensional array along a horizontal direction and a vertical direction in a paper plane of FIG. 2(a). Such array may define an array of memory cells. Although the openings are shown in FIG. 2(a) as being formed on the substrate (including the cell region in which the memory cell will be subsequently manufactured and a contact region in which a contact portion will be subsequently manufactured) with a substantially uniform size and a substantially uniform density, the present disclosure is not limited thereto. The sizes of the openings and/or the density of the openings may be varied, for example, the density of the openings in the contact region may be smaller than the density of the openings in the cell region, so as to reduce resistance in the contact region.

Figure 3:
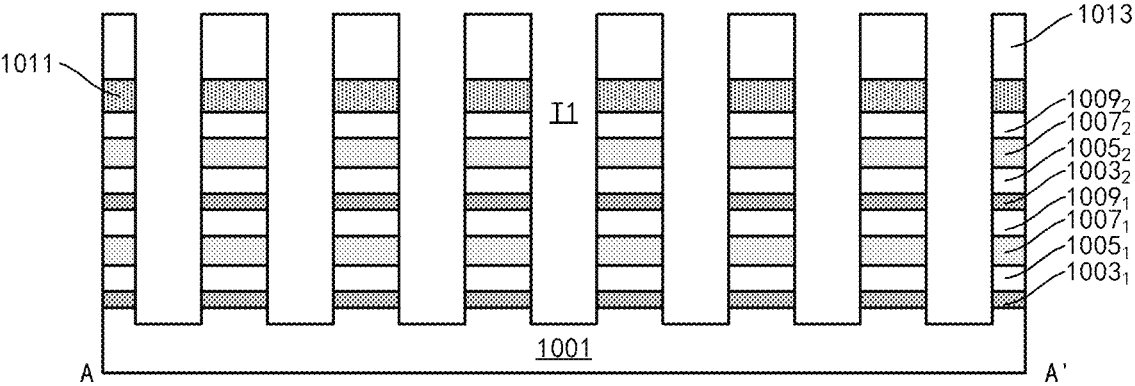

As shown in FIG. 3, the photoresist 1013 patterned in such way may be used as an etching mask to etch each layer on the substrate 1001 by anisotropic etching such as reactive ion etching (RIE), so as to form the first processing channel T1. RIE may be performed in a substantially vertical direction (such as a direction perpendicular to the surface of the substrate) and may be performed into the substrate 1001. Thus, a series of vertical first processing channels T1 are left on the substrate 1001. The first processing channel T1 in the cell region also defines a gate region. After that, the photoresist 1013 may be removed.

Currently, a sidewall of the sacrificial layer is exposed in the first processing channel T1. Therefore, the sacrificial layer may be replaced by an isolation layer through the exposed sidewall. Considering support functions of the device layer L1 and the device layer L2 during replacement, a support layer may be formed.

Figure 4:
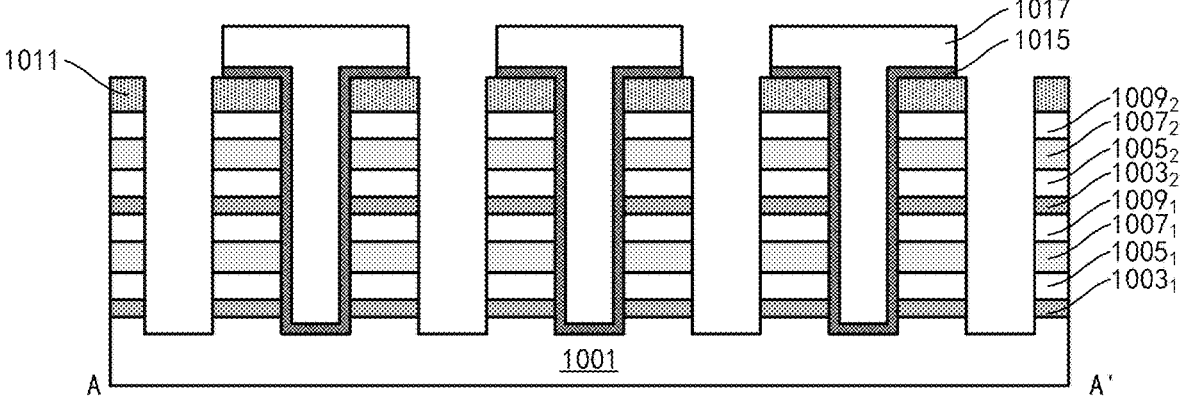

For example, as shown in FIG. 4, a support material layer may be formed on the substrate 1001 by depositing, such as chemical vapor deposition (CVD). The support material layer may be formed in a substantially conformal manner. Considering the etching selectivity, especially relative to the hard mask layer 1011 (a nitride in this example) and a subsequently formed isolation layer (an oxide in this example), the support material layer may include, for example, SiC. For example, by forming a photoresist 1017 and performing selectively etching such as RIE with the photoresist 1017, a part of the support material layer in one or more of first processing channels T1 may be removed while a part of the support material layer in the rest of first processing channels T1 may be retained. The remaining part of the support material layer forms a support layer 1015. In this way, on the one hand, the sacrificial layer may be replaced by a processing channel in which the support layer 1015 is not formed, and on the other hand, the device layer L1 and the device layer L2 may be supported by the support layer 1015 in the rest of processing channels. After that, the photoresist 1017 may be removed.

An arrangement of the processing channel in which the support layer 1015 is formed and the processing channel in which the support layer 1015 is not formed may be achieved by a pattern of the photoresist 1017. In addition, the processing channel in which the support layer 1015 is formed and the processing channel in which the support layer 1015 is not formed may be substantially evenly distributed for process consistency and uniformity. As shown in FIG. 4, the processing channel in which the support layer 1015 is formed and the processing channel in which the support layer 1015 is not formed may be arranged alternately.

Figure 5:
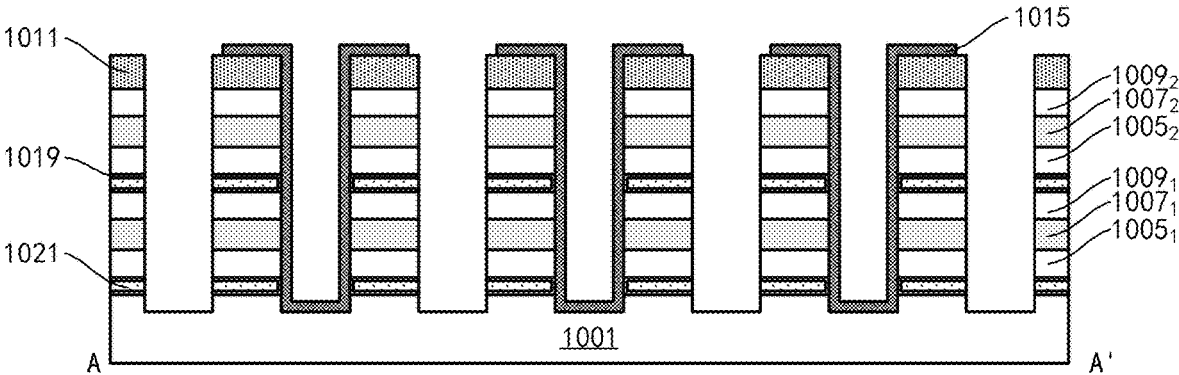

Next, as shown in FIG. 5, the sacrificial layers 1003$_1$ and 1003$_2$ may be removed by selectively etching through the first processing channel T1. Due to the existence of the support layer 1015, it is possible to maintain the device layers L1 and L2 from collapsing.

In the space released due to the removal of the sacrificial layers 1003$_1$ and 1003$_2$, a conductive metal layer 1019 and an isolation layer 1021 may be formed. For example, the conductive metal material such as tungsten (W) may be deposited in a substantially conformal manner, and a dielectric material such as oxide (such as silicon oxide) may be deposited, so as to fill the released space and the remaining gaps in the processing channel. Before depositing the conductive metal material, a conductive diffusion barrier layer may be formed. The deposited dielectric material and the conductive metal material (and the diffusion barrier layer, if present) may be etched back, such as RIE in the vertical direction, so as to remove the deposited dielectric material and the conductive metal material from the processing channel (the released processing channel will be used for the gate stack). However, by remaining in the space released due to the removal of the sacrificial layers 1003$_1$ and 1003$_2$, the conductive metal layer 1019 and the isolation layer 1021 may be obtained.

The conductive metal layer 1019 may extend on an upper surface of each device layer and a lower surface of each device layer, except for the upper surface (the surface may be used as a growth seed for other stacks on the first stack S1) of the uppermost device layer (in this example, the device layer L2). A portion of the conductive metal layer 1019 extending on the upper surface of each device layer and the lower surface of each device layer may then be configured as a BL/SL connection for memory cells in the corresponding device layer. In addition, due to the existence of the support layer 1015, there is a portion of the conductive metal layer 1019 that extends along the sidewall of the isolation layer 1021 at a position where the conductive metal layer 1019 is adjacent to the support layer 1015 (hereinafter referred to as "sidewall portion" for convenience), so that BL/SL connections of different device layers may be electrically connected to each other. This may be undesired.

Figure 6:
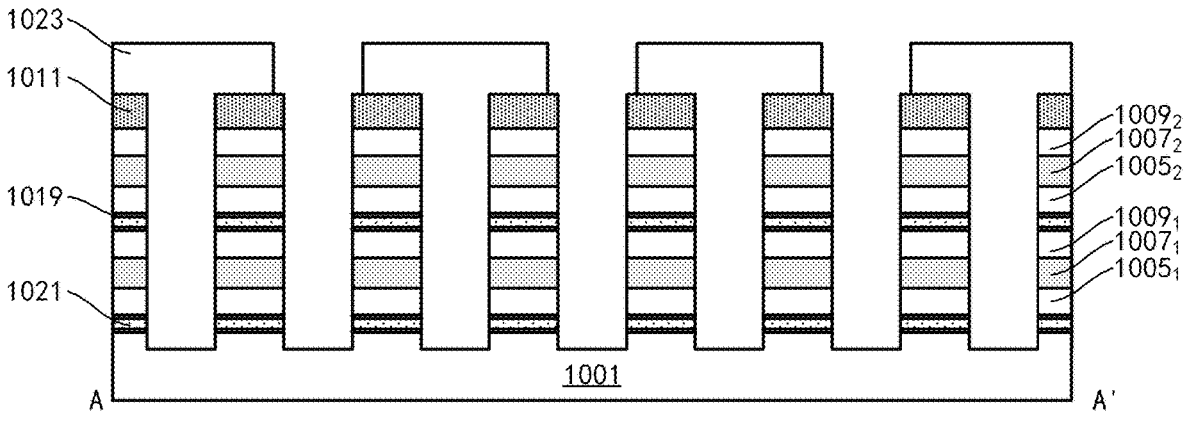

For this reason, as shown in FIG. 6, the support layer 1015 may be removed by selectively etching. A shielding layer 1023, such as a photoresist, may be formed in a processing channel in which a support layer 1015 is not previously formed, and the processing channel that previously formed a support layer 1015 may be exposed, so that the sidewall portion of the conductive metal layer 1019 is exposed in these processing channels. The sidewall portion of the conductive metal layer 1019 may be selectively etched through an unshielded processing channel. Therefore, the conductive metal layer 1019 may be left on the upper surface of each device layer and lower surface of each device layer to be configured as a BL/SL connection for memory cells in the corresponding device layer. The BL/SL connections of different device layers may be electrically isolated from each other. According to other embodiments, it is also possible to directly replace the sacrificial layer by the isolation layer instead of forming such conductive metal layer. The main purpose of the conductive metal layer is to further reduce a connection resistance, and the formation of the conductive metal layer does not hinder the electrical operation of the device.

After that, the shielding layer 1023 may be removed.

In the first processing channel T1, especially in the first processing channel T1 of the cell region, a gate stack may be formed. Here, in order to form a memory device, a memory function may be achieved through the gate stack. For example, the gate stack may include a memory structure such as a charge trapping material or a ferroelectric material.

Figure 7:
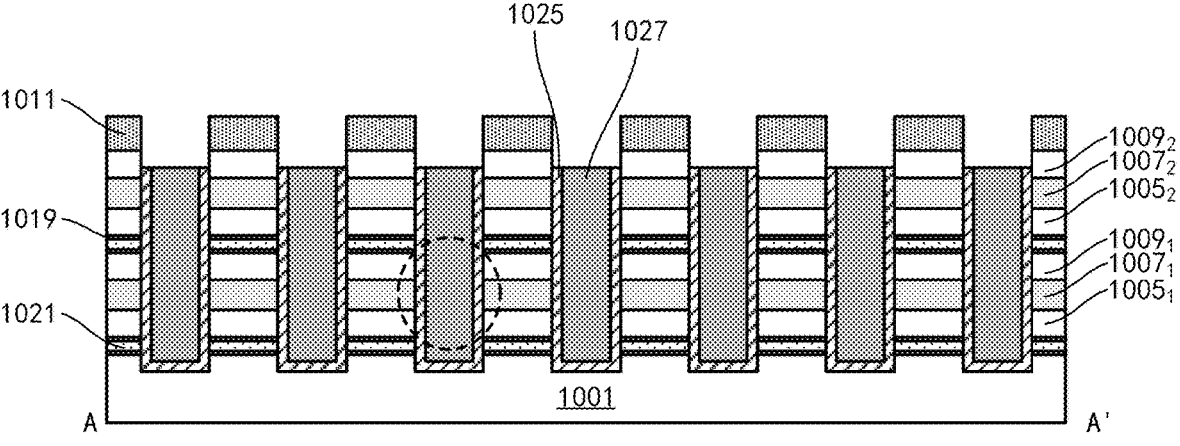

As shown in FIG. 7, a first memory functional layer 1025 and a first gate conductor layer 1027 may be formed sequentially by, for example, depositing. The first memory functional layer 1025 may be formed in a substantially conformal manner. A gap obtained after the first memory functional layer 1025 is formed in the first processing channel T1 may be filled with the first gate conductor layer 1027. A planarization treatment, such as chemical mechanical polishing (CMP, for example, CMP may stop at the hard mask layer 1011), may be performed on the formed first gate conductor layer 1027 and the formed first memory functional layer 1025, so that the first gate conductor layer 1027 and the first memory functional layer 1025 may be left in the first processing channel T1 to form a first gate stack. Here, considering the crystal quality in the subsequent growth process, it is possible to further etch back the planarized first gate stack, such that a top surface of the planarized first gate stack is between a top surface and a bottom surface of a second source/drain layer 1009$_1$ in the uppermost device layer (in this example, the device layer L2). Therefore, on the one hand, the first gate stack may overlaps with an entire vertical height of the channel layer 1007$_2$, so as to effectively control the channel region formed in the channel layer 1007$_2$, and on the other hand, a portion of the sidewall of the second source/drain layer 1009$_1$ may be exposed, so as to be subsequently determined as a growth seed.

The first memory functional layer 1025 may be based on a dielectric charge trapping, a ferroelectric material effect or a bandgap engineering charge memory (SONOS), etc. For example, the first memory functional layer 1025 may include a dielectric tunneling layer (such as an oxide with a thickness of about 1 nm to 5 nm, which may be formed by oxidation or ALD)—an energy band offset layer (such as a nitride with a thickness of about 2 nm to 10 nm, which may be formed by CVD or ALD)—an isolation layer (such as an oxide with a thickness of about 2 nm to 6 nm, which may be formed by oxidation, CVD or ALD). Such three-layer structure may lead to an energy band structure that traps an electron or a hole. Alternatively, the first memory functional layer 1025 may include a ferroelectric material layer, such as HfZrO$_2$ with a thickness of about 2 nm to 20 nm.

The first gate conductor layer 1027 may include, for example, (doped, such as p-type in the case of the n-type device) polysilicon or a metal gate material.

As shown in FIG. 7, the first gate stack (1025/1027) having the memory functional layer is surrounded by the device layer (in this example, device layers L1, L2). The first gate stack is cooperated with the device layer to define the memory cell, as shown in a dotted circle in FIG. 7. The channel region may be connected to source/drain regions at opposite sides of the channel region, and the channel region may be controlled by the first gate stack. One of the source/drain regions at an upper end and a lower end of a single memory cell is configured as a source region and may be electrically connected to a source line; and the other one of the source/drain regions at an upper end and a lower end of a single memory cell is configured as a drain region and may be electrically connected to a bit line. In a case of forming an NOR-type memory device, for every two vertically adjacent memory cells, the source/drain region at an upper end of a lower memory cell and the source/drain region at a lower end of an upper memory cell may be configured as the source region, so that they may share the same source line connection.

The first gate stack extends in a column shape in the vertical direction and intersects with the plurality of device layers, so as to define a plurality of memory cells which are stacked in the vertical direction. Memory cells associated with a single gate stack column may form a memory cell string. Correspondingly to an arrangement of the gate stack columns (corresponding to the arrangement of the first processing channel T1 mentioned above, such as the two-dimensional array), a plurality of such memory cell strings are arranged on the substrate, so as to form a three-dimensional (3D) array of memory cells.

In this way, the manufacturing of memory cells in the first stack S1 is completed. According to embodiments of the present disclosure, one or more such stacks may also be similarly manufactured, so as to increase a number of stacks in the memory cell and thus increase the capacity of the memory device.

Figure 8A:
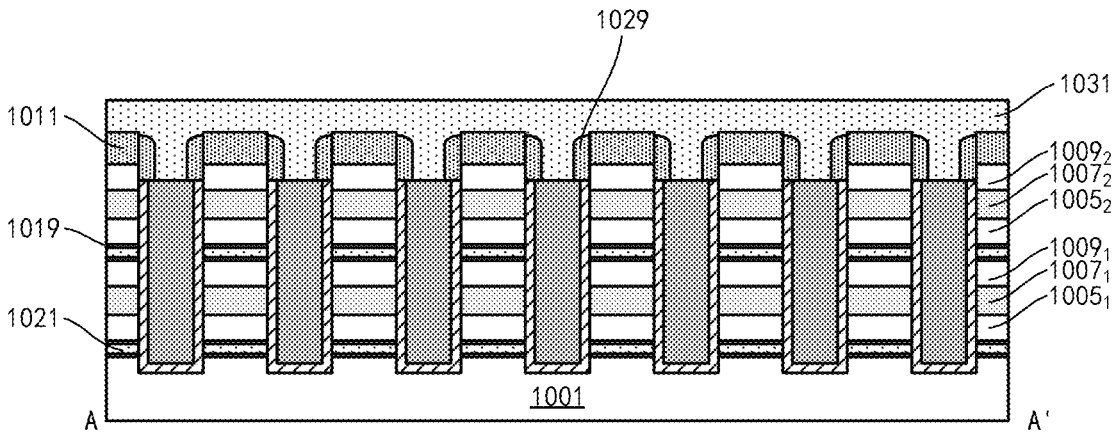

As shown in FIG. 8(*a*), a protective spacer 1029 may be formed on a top surface of the first gate stack in each first processing channel T1 through a spacer formation process. For example, a layer of dielectric may be deposited in a substantially conformal manner, and then anisotropic etching such as RIE in the vertical direction may be performed on the deposited dielectric, so as to remove a lateral extending portion of the deposited dielectric and retain a vertical extending portion of the deposited dielectric, thereby forming the protective spacer 1029. The protective spacer 1029 thus formed extends in a circular shape along a sidewall of the first processing channel T1, so that the subsequent formation of another second gate conductor layer is electrically isolated from the first stack S1 (especially the second source/drain layer 1009$_1$ exposed as a part of the sidewall for growing seeds as described above). Here, considering the etching selectivity between the protective spacer 1029 and the later formed isolation layer (such as 1031 in FIG. 8(*a*) or 8(*b*)), the protective spacer 1029 may include a nitride.

In addition, a top surface of the first gate conductor layer 1027 is still (partially) exposed in each first processing channel T1. In order to avoid undesired electrical connection between the subsequently formed seed layer and the first gate conductor layer 1027, an isolation layer 1031 may be formed to shield the top surface of the first gate conductor layer 1027. For example, the isolation layer 1031 may be formed by depositing and subsequent planarization, such as CMP oxide.

According to other embodiments, instead of forming a protective spacer 1029, as shown in FIG. 8(*b*), in a process of etching back the first gate stack described above in conjunction with FIG. 7, the first gate conductor layer 1027 may be selectively etched, instead of etching the first memory functional layer 1025. In this way, a portion of the first memory functional layer 1025 protruding above the top surface of the first gate conductor layer 1027 may be similarly configured as the protective spacer. Similarly, the isolation layer 1031 may be formed.

Next, the second source/drain layer 1009$_2$ of the uppermost device layer in the first stack S1 (in this example, L2) may be taken as a seed to grow a seed layer as a growth basis for other layers.

Figure 9:
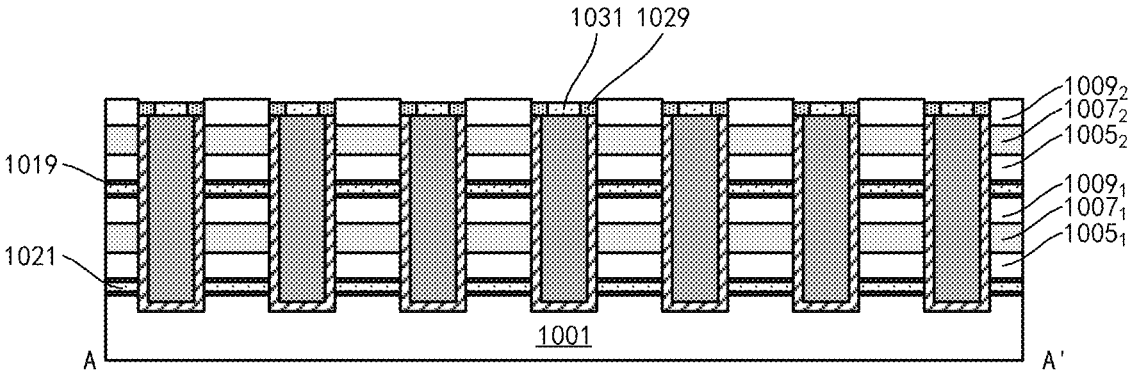

For this reason, as shown in FIG. 9, by a planarization process such as CMP may be used, CMP may stop at the upper surface of the second source/drain layer 1009$_2$ in the uppermost device layer in the first stack S1 (in this example, L2), so as to expose the upper surface for being determined as a growth seed. In addition, in order to improve a quality of the seed layer grown on such growth seed, the planarized protective spacer 1029 (and optionally, the isolation layer 1031) may also be etched back to a certain extent, so as to expose a part of the sidewall of the second source/drain layer 1009$_2$ of the uppermost device layer in the first stack S1 (in this example, L2).

Figure 10:
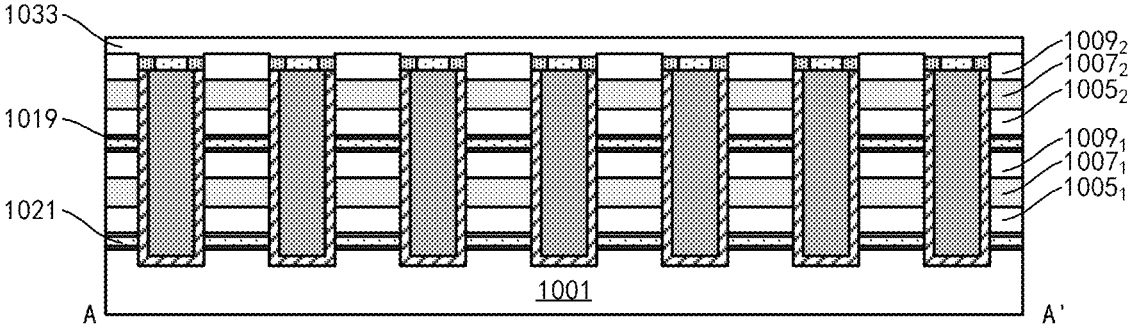

Next, as shown in FIG. 10, the exposed portion of the second source/drain layer 1009$_2$ (such as the upper surface and part of the sidewall) of the uppermost layer in the first stack S1 (in this example, L2) may be determined as the growth seed to form the seed layer 1033 through epitaxial growth. A semiconductor material grown from a periphery of each first processing channel T1 (such as the sidewall exposed by the second source/drain layer 1009$_2$ in each first processing channel T1) may grow towards the first processing channel T1 and be bonded to each other, so that the seed layer 1033 may form a semiconductor layer that continuously extends on the first stack S1, especially a single crystal semiconductor layer. If it is required, the growing seed layer 1033 may also be planarized, so that the top surface of the seed layer 1033 is substantially planarized and extended. Here, a selective epitaxial growth process may be performed to reduce defects in the seed layer 1033, especially in the region in which the first processing channel T1 is located, since the seed layer 1033 grows from the second source/drain layer 1009$_2$ of the single crystal (which may obtain the single crystal), rather than from the protective spacer 1029 and the isolation layer 1031 (which may obtain polysilicon or amorphous).

Here, the seed layer 1033 is in physical contact with the second source/drain layer 1009$_2$ of the uppermost device layer (in this example, L2) in the first stack S1. Therefore, in addition to being configured as the growth basis for the upper stack, it may also be used together with the second source/drain layer 1009$_2$ to define the source/drain region of the memory cell in the device layer L2 (therefore, it may also be considered as a part of the device layer L2, especially the second source/drain layer 1009$_2$ in the device layer L2). Therefore, the seed layer 1033 may include the same material as the device layer L2 (especially the second source/drain layer 1009$_2$) (in this example, Si), and may include substantially the same doping type and doping concentration (for example, in situ doping during growth).

Figure 11:
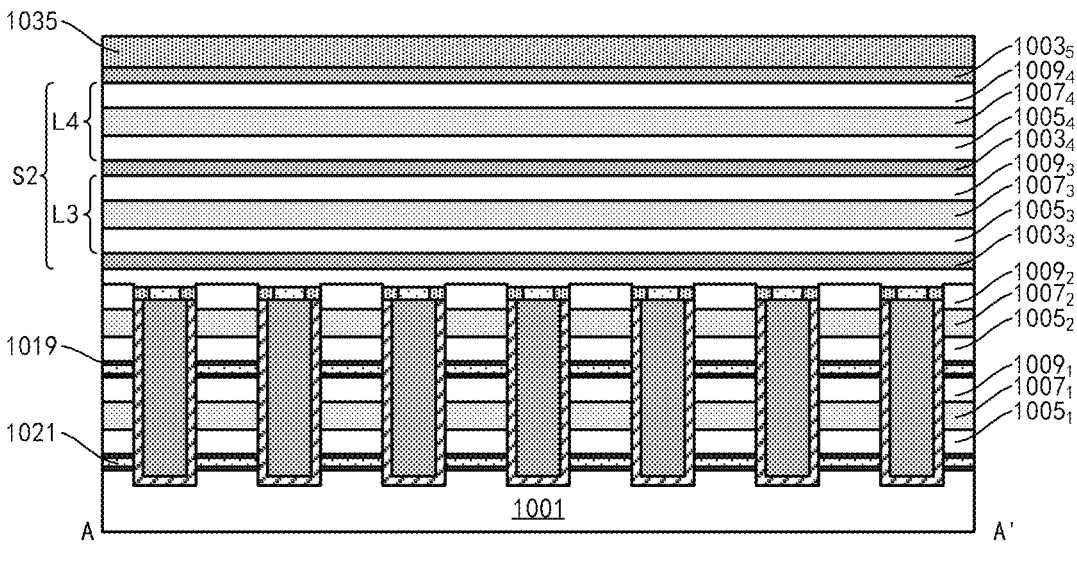

As shown in FIG. 11, a first stack S1 is formed on the substrate 1001 as described above in combination with FIG. 1, and a second stack S2 may be formed on the seed layer 1033 in the same or similar manner. The second stack S2 may include device layers L3 and L4 (the specific number of device layers is not limited thereto). The device layer L3 may include a first source/drain layer 1005$_3$, a channel layer 1007$_3$ and a second source/drain layer 1009$_3$. The device layer L4 may include a first source/drain layer 1005$_4$, a channel layer 1007$_4$ and a second source/drain layer 1009$_4$. In addition, sacrificial layers 10033 and 10034 may be similarly disposed. When the second stack S2 is the uppermost layer in the memory device, a sacrificial layer $1003_5$ may also be disposed on the second stack S2, so as to dispose a BL/SL connection for the second source/drain layer $1009_4$ of the uppermost device layer (in this example, the device layer L4) of an uppermost stack (in this example, the second stack S2) through replacing the sacrificial layer $1003_5$ by a conductive metal layer (and an isolation layer) as described above. Similarly, in order to facilitate patterning, a hard mask layer 1035 may be formed on the second stack S2. Regarding the device layer, the sacrificial layer and the hard mask layer 1035 in the second stack S2, the above-mentioned explanation in conjunction with FIG. 1 may be referred to. For example, the second stack S2 may have the same configuration as the first stack S1 (except for a case of being configured as the uppermost layer, the sacrificial layer $1003_5$ is added). Similarly, in order to facilitate the etching of the processing channel or the hole, the total thickness of the second stack S2 may be, for example, about 2 μm to 10 μm.

Although only two stacks S1 and S2 are shown here, the present disclosure is not limited thereto. More stacks may be included, so as to increase the memory capacity of the memory device.

Figure 12:
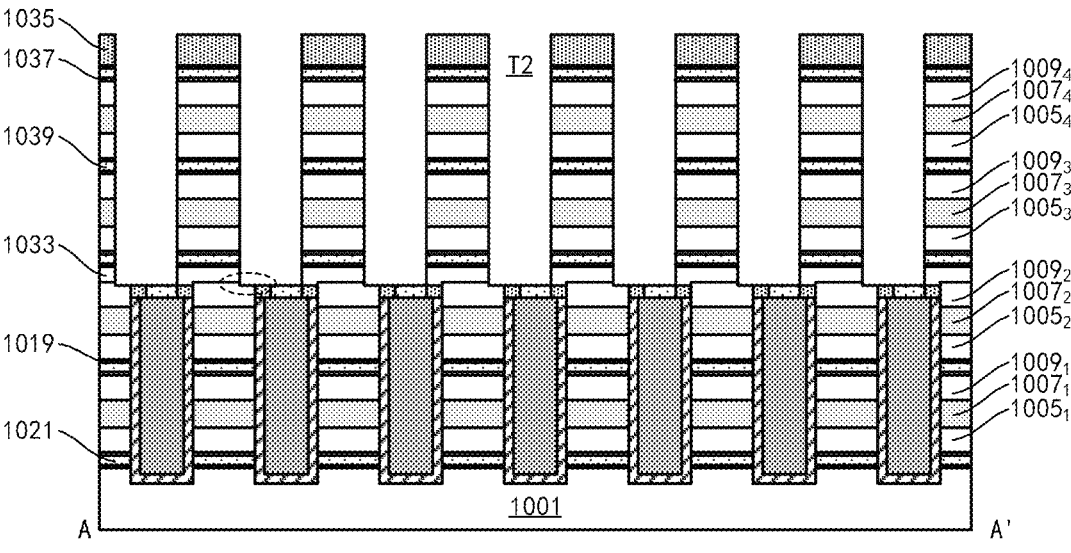

As shown in FIG. 12, for the second stack S2, as above-mentioned in combination with FIGS. 2(a) to 3, the second processing channel T2 may be formed in the second stack S2 through anisotropic etching, such as RIE. During etching, the protective spacer 1029 and/or the isolation layer 1031 may be configured as a stop layer. The mask used to form the second processing channel T2 may be the same as the mask used to form the first processing channel T1. However, due to manufacturing tolerances (such as offset errors) and other factors, the second processing channel T2 obtained through the same mask may have a deviation relative to the first processing channel T1, as shown by the dotted circle in the figure. Of course, such offset is relatively small relative to the sizes of the first processing channels T1 and T2, so that the second processing channel T2 may still maintain a connection to the first processing channel T1 (where a gate stack, the protective spacer 1029 and the isolation layer 1031 are currently formed). In addition, as shown in FIGS. 4 to 6 above, the sacrificial layers $1003_3$, $1003_4$, and $1003_5$ may be removed through the second processing channel T2, and the conductive metal layers 1037 and the isolation layers 1039 may be formed in the space released due to the removal of the sacrificial layers $1003_3$, $1003_4$, and $1003_5$.

Figure 13:
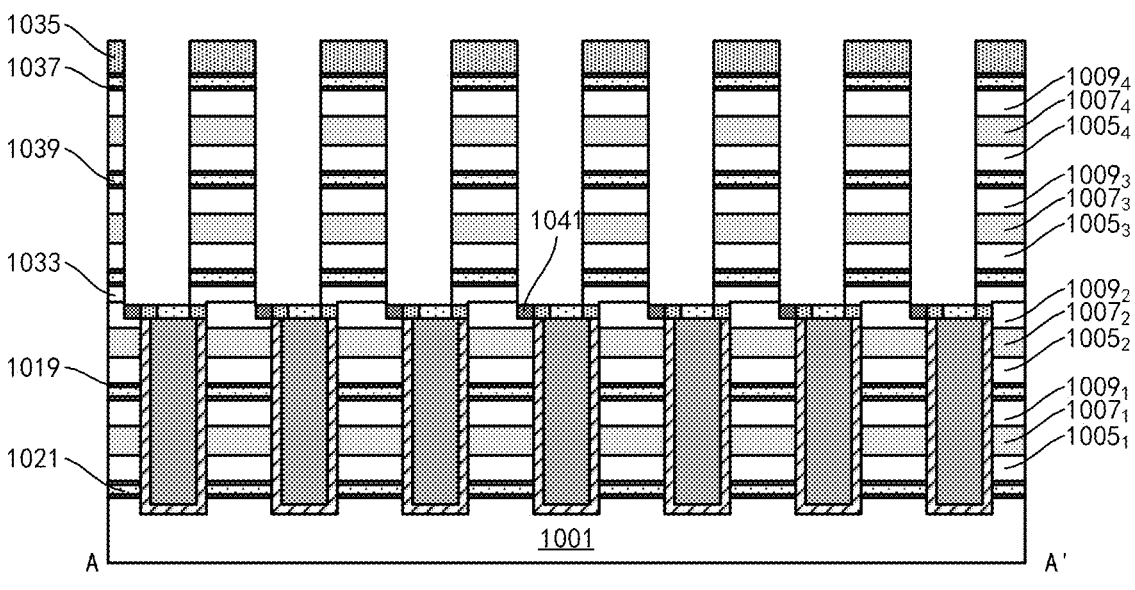

As shown in the dotted circle in FIG. 12, due to the offset of the lithography, the second source/drain layer $1009_2$ of the uppermost device layer (in this example, L2) in the first stack S1 may be partially exposed at a bottom of the second processing channel T2. In order to avoid an undesired electrical connection between the exposed portion of the second source/drain layer $1009_2$ and the second gate conductor layer formed subsequently in the second processing channel T2, as shown in FIG. 13, the exposed portion of the second source/drain layer $1009_2$ may be etched by selectively etching through the second processing channel T2, such as RIE, so as to form an isolation groove. An etching depth D is, for example, about 10 nm to 30 nm. On the one hand, the etching depth D may be greater than the offset of the etching, so that the isolation layer formed in the isolation groove may reliably isolate the second gate conductor layer formed in the second processing channel T2 from the second source/drain layer $1009_2$; and on the other hand, the etching depth D may be smaller than a thickness of the second source/drain layer $1009_2$, so as to prevent the isolation groove from extending into the channel layer $1007_2$. In order to more accurately control the etching depth D, atomic layer etching (ALE) may be used. An isolation layer 1041 may be formed in the isolation groove by depositing and then etching back the dielectric. A deposition thickness of the dielectric may be greater than the etching depth D, so as to fill the isolation groove. In order to control the deposition thickness more accurately, atomic layer deposition (ALD) may be used. In addition, considering the etching selectivity (especially relative to the hard mask layer 1035, the protective spacer 1029 and the isolation layer 1031), the isolation layer 1041 may include, for example, SiC.

After that, a gate stack may be formed similarly in the second processing channel T2.

Figure 8B:
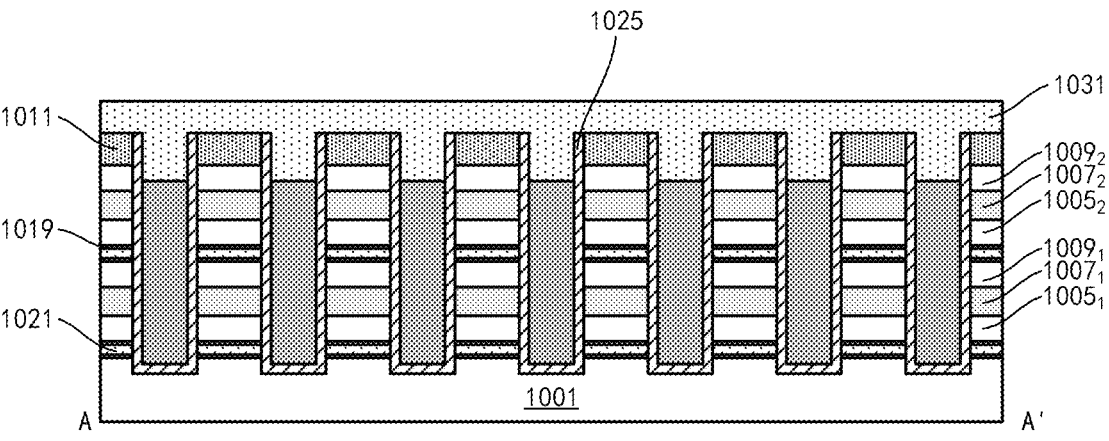
Figure 14:
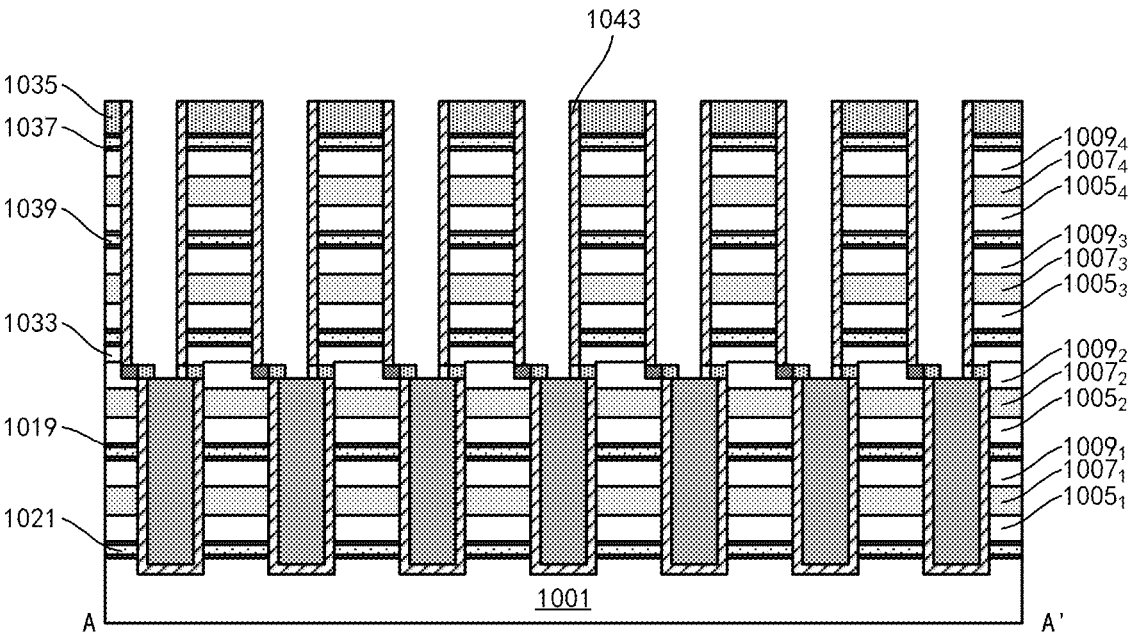

As mentioned above, a processing channel may correspond to a memory cell string. Each first processing channel T1 in the first stack S1 and a corresponding second processing channel T2 in the second layer S2 communicate with each other (although there is an offset) and may correspond to the same memory cell string. More specifically, the gate stacks formed in the first processing channel T1 in the first stack S1 and the gate stacks formed in the corresponding second processing channel T2 in the second stack S2 may be electrically connected to each other and correspond to a same word line WL. In order to achieve electrical connection between the gate stacks in the corresponding processing channels, as shown in FIG. 14, a second memory functional layer 1043 that extends vertically along the sidewall of the second processing channel T2 may be formed in the second processing channel T2, instead of that sort of the first memory functional layer 1025 extending along a bottom of the first processing channel T1 in the first processing channel T1. Such second memory functional layer 1043 may be formed through a spacer process. Considering the consistency of performance between memory cells, the second memory functional layer 1043 may have the same configuration as the first memory functional layer 1025 (for example, a substantially same stack structure in which each layer has substantially the same material composition and thickness). In addition, through the second processing channel T2 (with the second memory functional layer 1043 formed on the sidewall), the isolation layer 1031 may be etched by selectively etching such as RIE in the vertical direction to form an opening in the isolation layer 1031, so as to expose a lower first gate stack (especially the first gate conductor layer 1027), so that the second processing channel T2 (especially the second gate conductor layer to be formed subsequently) communicates with the first processing channel T1 (especially the first gate conductor layer 1027 already formed therein). Since the isolation layer 1031 is surrounded by the circular protective spacer 1029 (or a protruding portion of the first memory functional layer 1025, as shown in FIG. 8(b)) in each first processing channel T1, the sidewall of the first processing channel T1 (especially the sidewall of the semiconductor layer in the first stack S1) is not exposed to be in contact with the subsequently formed second gate conductor layer by the opening in the isolation layer 1031.

Figure 15A:
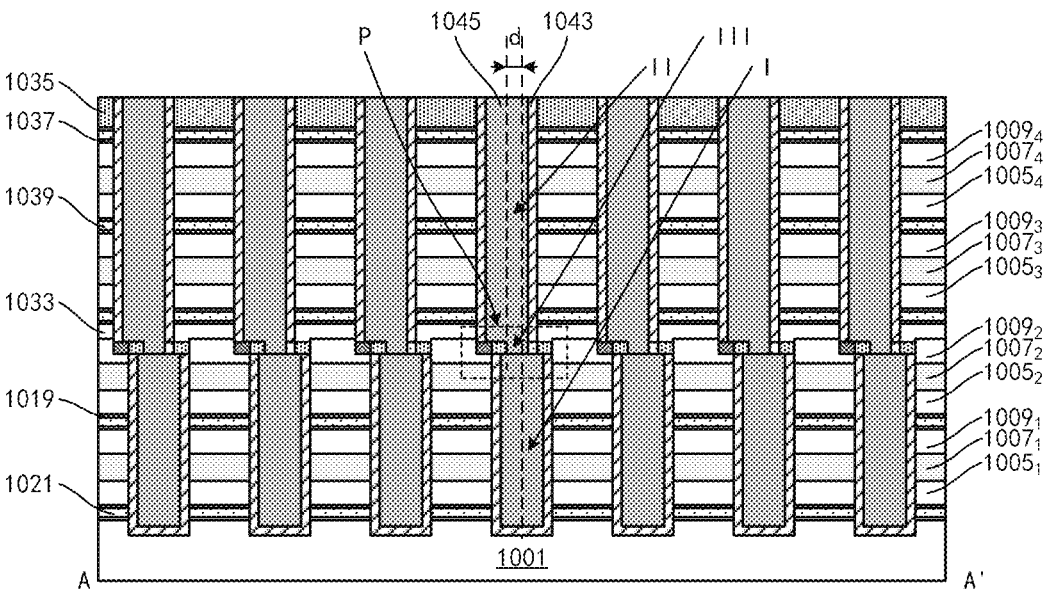
Figure 15B:
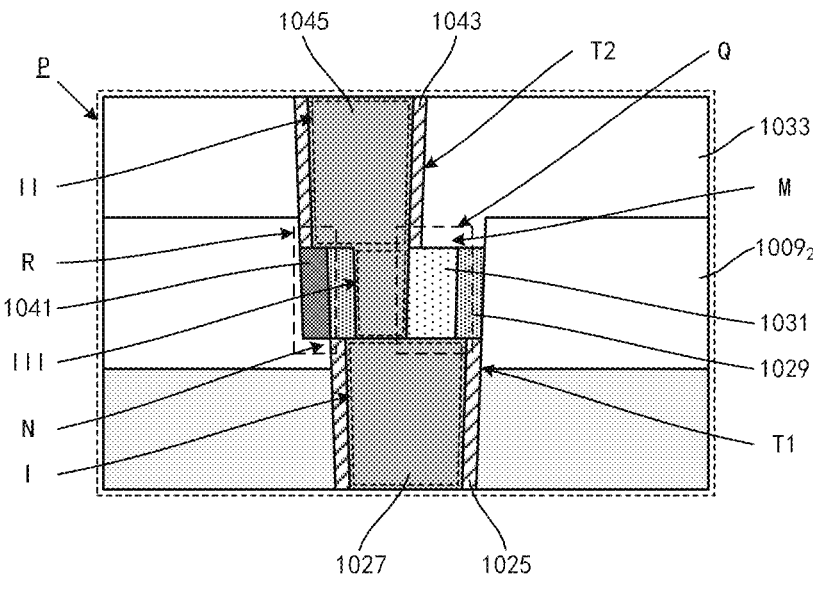
Figure 15C:
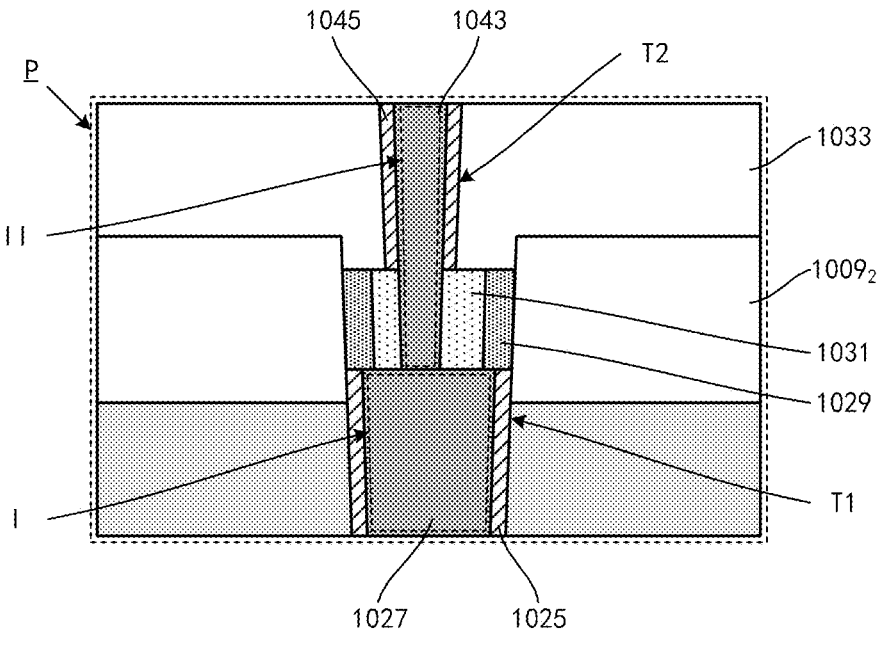
Figure 15D:
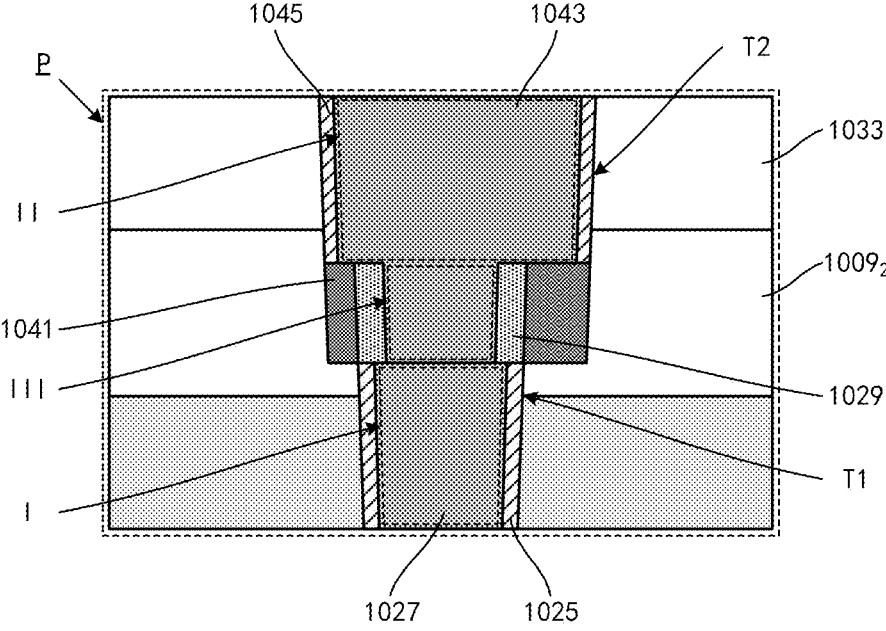

Next, as shown in FIG. 15(a), a second gate conductor layer 1045 may be formed by depositing and then performing planarization on the conductive material. Considering the consistency of performance between memory cells, the second gate conductor layer 1045 may have the same configuration as the first gate conductor layer 1027 (for example, a substantially same stack structure in which each layer has substantially the same material composition and thickness).

Therefore, the second gate stack (1043/1045) having the memory functional layer is surrounded by the device layer (in this example, device layers L3, L4). The second gate stack is cooperated with the device layer to define the memory cell.

The second gate stack is adjacent to the first gate stack (especially when the second gate conductor layer 1045 and the first gate conductor layer 1027 are physically in contact with each other), so as to be regarded as "gate stack" generally extending vertically. The gate stack intersects with the device layers (such as L1, L2, L3, L4) in the first stack S1 and the second stack S2 to form a corresponding memory cell string.

The vertically extended gate stack has a surface in a bended shape at a position where the first layer S1 is adjacent to the second layer S2.

FIG. 15(*b*) is a schematic enlarged view of part P in FIG. 15(*a*). It is noted that FIG. 15(*b*) shows that the processing channels T1 and T2 have inclined sidewalls (for example, due to limited capabilities of the etching process). In other illustrations, just for the sake of convenience, such possible sidewall inclination is not shown.

As shown in FIGS. 15(*a*) and 15(*b*), the first gate conductor layer 1027 and the second gate conductor layer 1045 which are in physical contact with each other may be used together as a gate conductor layer of the gate stack. The gate conductor layer may include a first part I extending in the first stack S1, a second part II above the first part I, and a connection part III between these two parts. The connection part III may have a reduced width relative to the first part I (especially a top of the first part I) and the second part II (especially a top of the second part II). Due to the offset error mentioned above, a straight line along which a vertical centerline of the first part I extends may not coincide with a straight line along which a vertical centerline of the second part II extends (see the dotted line in FIG. 15(*a*)). For example, there is a lateral distance d between the straight line along which the vertical centerline of the first part I extends and the straight line along which the vertical centerline of the second part II extends, where the lateral distance d is limited by an offset accuracy of a lithography system, and d is greater than about 2 nm.

It is noted that FIG. 15(*b*) only shows a local region. The first part I of the gate conductor layer may extend downwards from the region shown in FIG. 15(*b*), and the second part II of the gate conductor layer may extend upwards from the region shown in FIG. 15(*b*), as shown in FIG. 15(*a*).

The first memory functional layer 1025 extends on the sidewall of the first part I of the gate conductor layer (and bottom, as in this example, the first part I is a lowest part of the gate stack), and the second memory functional layer 1043 may extend on the sidewall of the second part II of the gate conductor layer. The first memory functional layer 1025 and the second memory functional layer 1043 are respectively formed as described above, and may be disconnected or discontinuous from each other. Such discontinuity results in an absence of a memory functional layer on the sidewall of the connection part III of the gate conductor layer. As mentioned above, the protective spacer 1029 may surround the connection part III, so as to prevent an undesired electrical connection between the gate conductor layer (especially the connection part III) and the device layer.

As shown in a dotted line box Q in the figure, a top of the first part I of the gate conductor layer may have a portion which overlaps with the uppermost device layer in the first stack S1 (in this example, L2, especially the seed layer 1033, which may be considered as a part of the device layer L2, especially a part of the second source/drain layer 1009$_2$ in the device layer L2) in the vertical direction. A size of the overlap portion depends on the offset d of the second processing channel T2 relative to the first processing channel T1 (in a case that the offset is small, the overlap portion may not exist). As mentioned above, the isolation layer 1031 may be located between the top of the first part I of the gate conductor layer and the uppermost device layer in the first stack S1, so as to prevent an undesired electrical connection between the gate conductor layer (especially the first part I) and the device layer. For example, a sidewall of the seed layer 1033 facing the gate stack may include a portion extending along the sidewall of the first processing channel T1 and a portion extending along the sidewall of the second processing channel T2, which are formed as a downward extension portion as shown in M due to the offset of the second processing channel T2 relative to the first processing channel T1. The isolation layer 1031 may be formed below the extension portion N.

As shown in a dotted line box R in the figure, a bottom of the second part II of the gate conductor layer may have a portion which overlaps with the uppermost device layer in the first stack S1 (in this example, L2, especially the second source/drain layer 1009$_2$ in L2) in the vertical direction. A size of the overlap portion depends on the offset d of the second processing channel T2 relative to the first processing channel T1 (in a case that the offset is small, the overlap portion may not exist). As mentioned above, the isolation layer 1041 may be located between the bottom of the second part II of the gate conductor layer and the uppermost device layer in the first stack S1, so as to prevent an undesired electrical connection between the gate conductor layer (especially the second part II) and the device layer. For example, a sidewall of the second source/drain layer 1009$_2$ facing the gate stack may include a portion extending along the sidewall of the first processing channel T1 and a portion extending along the sidewall of the second processing channel T2, which are formed a step portion as shown in N due to the offset of the second processing channel T2 relative to the first processing channel T1. The isolation layer 1041 may be formed on the step portion N.

In the examples shown in FIGS. 15(*a*) and 15(*b*), when viewed from above, a region defined by the top of the first part I of the gate conductor layer partially overlaps with a region defined by the bottom of the second part II of the gate conductor layer. However, depending on the relative size and the offset d between the first processing channel I (especially the top of the first processing channel I) and the second processing channel II (especially the bottom of the second processing channel II), different configurations may be existed.

For example, as shown in FIG. 15(*c*), if a top size of the first processing channel I is relatively large compared to a bottom size of the second processing channel II, when viewed from above, the region defined by the bottom of the second part II of the gate conductor layer may be within the region defined by the top of the first part I of the gate conductor layer (as mentioned above, due to the offset d, straight lines along which respective centerline lines extends may not coincide with each other). In this case, in the process of forming the second processing channel T2 described above in conjunction with FIG. 12, the bottom of the second processing channel T2 may be completely settled on the protective spacer 1029 and/or the isolation layer 1031 formed in the first processing channel T, and the device layer in the first stack S1 may not be exposed at the bottom of the second processing channel T2. Therefore, in the process of forming the isolation layer 1041 described above in conjunction with FIG. 13, the isolation layer 1041 will not be truly formed. In addition, in this embodiment, the second part II may continuously extend to the top of the first part I, while there may be no connection part III with the width mutated relative to the first part I and the second part II as described above.

For another example, as shown in FIG. 15(*d*), if the top size of the first processing channel I is relatively large compared to the bottom size of the second processing channel II, when viewed from above, the region defined by the top of the first part I of the gate conductor layer may be within the region defined by the bottom of the second part II of the gate conductor layer (as mentioned above, due to the offset d, the straight lines along which respective centerline lines extends may not coincide with each other). In this case, in the process of opening in the isolation layer 1031 described above in conjunction with FIG. 14, the isolation layer 1031 may be completely removed. Therefore, the connection part III may be surrounded by the protective spacer 1029, and there may be no isolation layer 1031 between the connection part III and the protective spacer 1029.

In this way, the manufacturing of the memory cell (in the cell region) is completed. Next, various electrical contact portions may be manufactured (in the contact region) to achieve the required electrical connection.

Figure 16A:
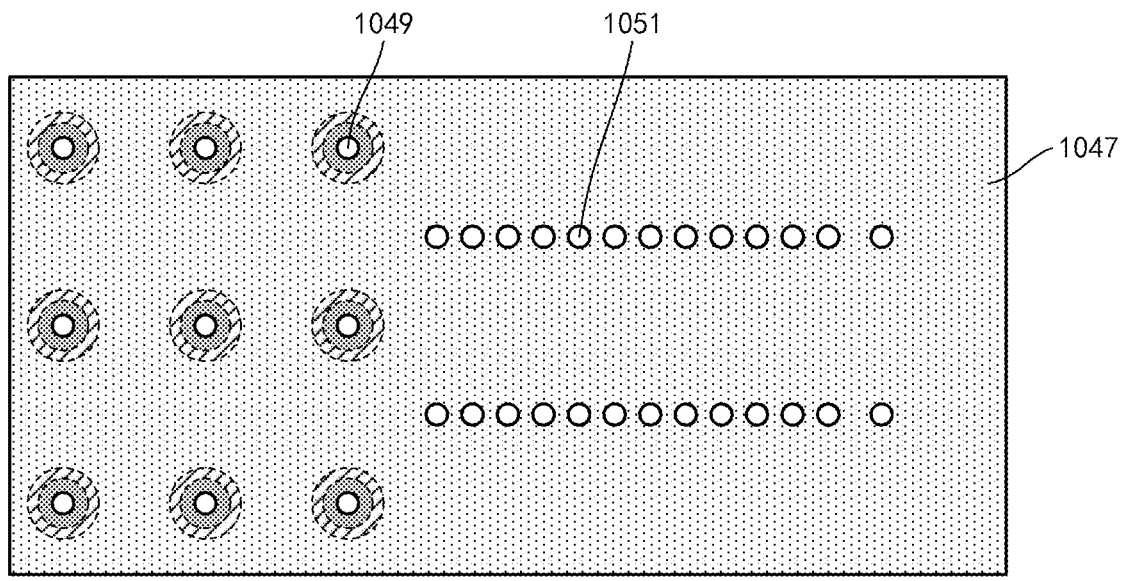
Figure 16B:
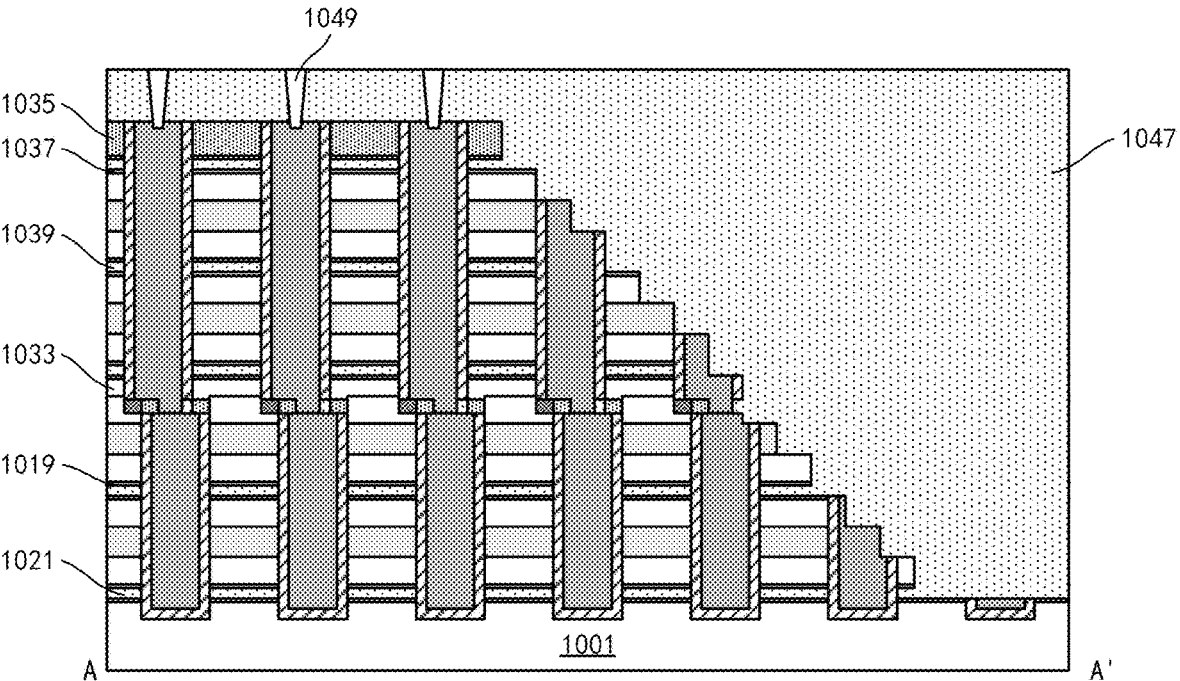
Figure 16C:
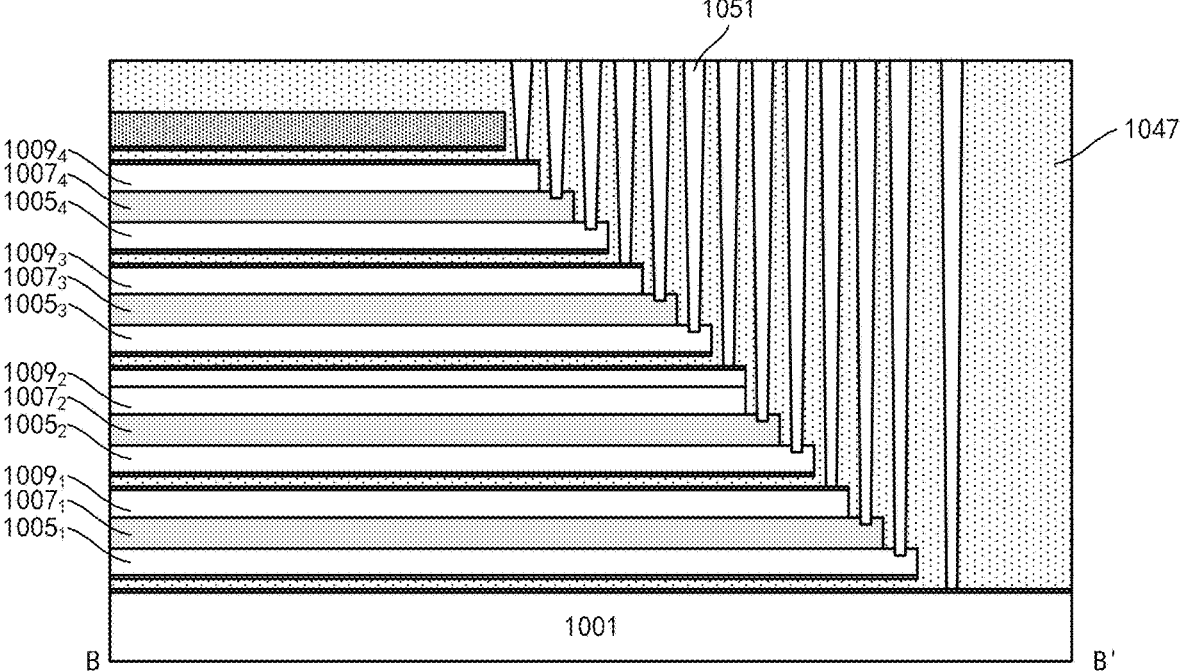

In order to achieve an electrical connection to each device layer, a step structure may be formed in the contact region. Such step structure may be formed in various manners in the art, which will not be repeated here. As shown in FIGS. 16(*a*), 16(*b*) and 16(*c*), the step structure is formed, so that each source/drain region (the conductive metal layer on the surface is also patterned with the corresponding source/drain region) that needs to be electrically connected and an optional channel region in each device layer respectively has an end portion protruded relative to the above region, so as to define a landing pad of a contact portion to such region.

After forming the step structure in the contact region, an interlayer dielectric layer 1047 may be formed by depositing such as oxide and planarization such as CMP. Here, the previous isolation layers 1021 and 1039 are shown to be integral with the interlayer dielectric layer 1047 since both of them are made of oxides. Next, as shown in the figure, contact portions 1049 and 1051 may be formed in the interlayer dielectric layer 1047. Specifically, the contact portion 1049 is formed in the cell region and electrically connected to the second gate conductor layer 1045 in the gate stack (and thus electrically connected to the first gate conductor layer 1027). The contact portion 1051 is formed in the contact region and electrically connected to each source/drain region and an optional channel region. The contact portion 1051 in the contact region may bypass the gate stack left in the contact region. Such contact portions may be formed by etching holes in the interlayer dielectric layer 1047 and filling the holes with a conductive material such as a metal.

Here, the contact portion 1049 may be electrically connected to a word line. A gate control signal may be applied to the gate conductor layers 1027 and 1045 through the word line by the contact portion 1049. The contact portion 1051 may be electrically connected to a source line or a bit line. More specifically, for the same memory cell, one source/drain region may be electrically connected to the bit line, while another source/drain region may be electrically connected to the source line. Due to the existence of conductive metal layers 1019 and 1037, the resistance may be reduced when electrical signals from the bit line and the source line are applied to the corresponding source/drain region. Here, a contact portion to the channel region is formed. Such contact portion may be referred as a bulk contact portion and may receive bulk bias, so as to adjust a threshold voltage of the device.

Figure 17:
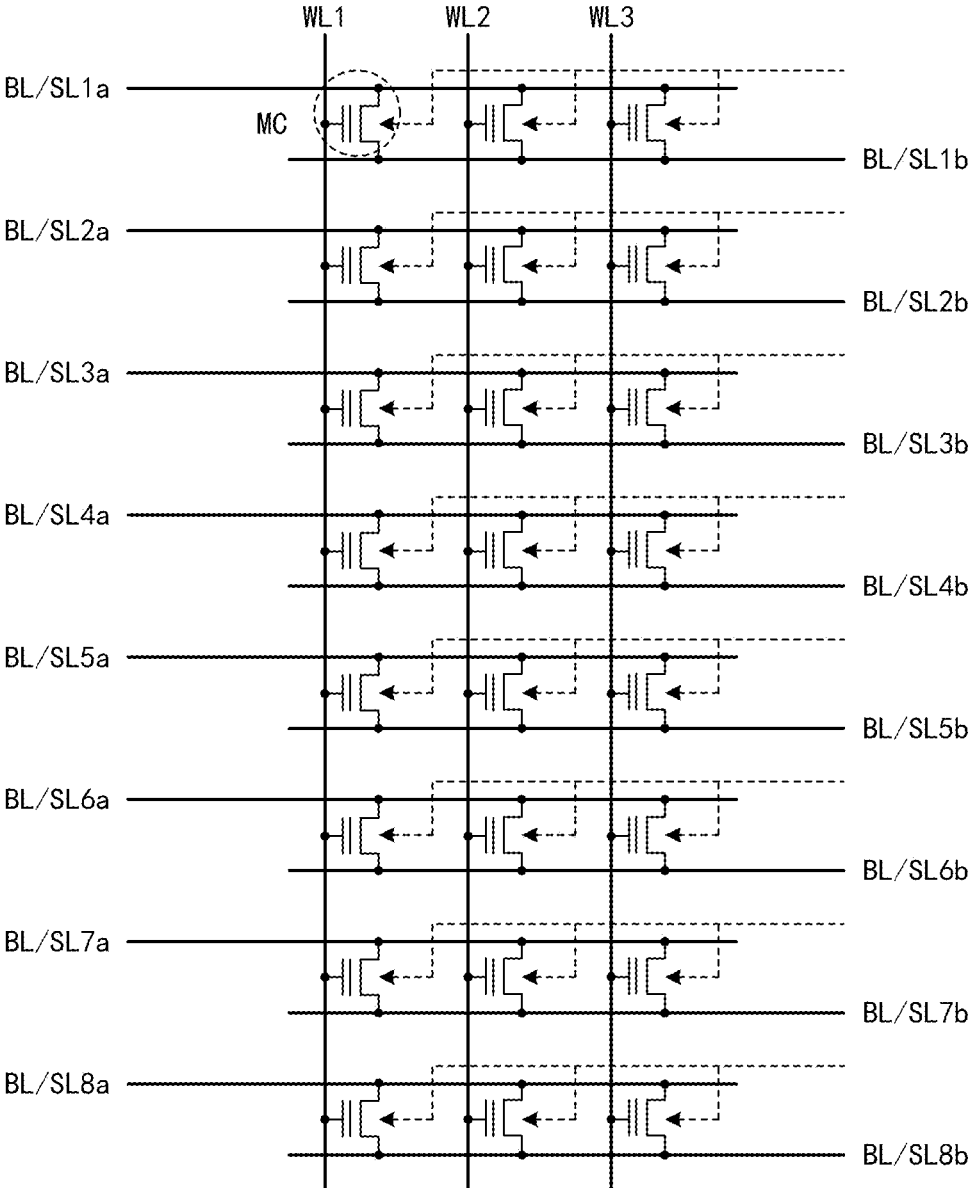
FIG. 17 schematically shows an equivalent circuit diagram of an AND-type memory device according to an embodiment of the present disclosure.

FIG. 17 schematically shows an equivalent circuit diagram of an AND-type memory device according to an embodiment of the present disclosure.

In an example shown in FIG. 17, eight memory cell layers are stacked (four device layers L1 to L4 in the previous embodiments respectively form one of the corresponding memory cell layers), and three word lines WL1, WL2, and WL3 passing through such eight memory cell layers. As mentioned above, such memory cell layers may be formed in multiple times (for example, a part of the memory cell layer such as the lower four memory cell layers are formed through the first stack S1, a part of the memory cell layer such as the upper four memory cell layers are formed through the second stack S2, and so on), thereby reducing the difficulty of etching processing channels. Each word line WL1, WL2, and WL3 may correspond to a gate stack vertically extending (with a bend portion), including, for example, a first gate conductor layer and a second gate conductor layer.

The memory cells in each memory cell layer may be connected in parallel between the corresponding bit lines/source lines. The figure schematically shows bit/source lines BL/SL1*a*, BL/SL1*b*, BL/SL2*a*, BL/SL2*b*, BL/SL3*a*, BL/SL3*b*, BL/SL4*a*, BL/SL4*b*, BL/SL5*a*, BL/SL5*b*, BL/SL6*a*, BL/SL6*b*, BL/SL7*a*, BL/SL7*b*, BL/SL8*a* and BL/SL8*b* for such eight memory cell layers. One (e.g. BL/Slia) of each pair of bit lines/source lines BL/Slia and BL/SLib (where $1 \leq i \leq 8$) may be configured as a bit line, while the other one (e.g. BL/SLib) of each pair of bit lines/source lines BL/Slia and BL/SLib (where $1 \leq i \leq 8$) may be configured as a source line. It should be pointed out that the number of layers of the memory cell, the number of bit lines/source lines and the number of word lines are not limited thereto. At an intersection of the bit line and the word line, a memory cell MC is provided. In addition, FIG. 17 also schematically shows an optional bulk connection to each memory cell by dotted lines.

Here, for the sake of illustration convenience, a two-dimensional array of the memory cell MC is shown. A plurality of such two-dimensional arrays may be arranged in a direction (such as a direction perpendicular to a paper surface in the figure) intersecting with such two-dimensional array, so as to obtain a three-dimensional array.

Figure 18:
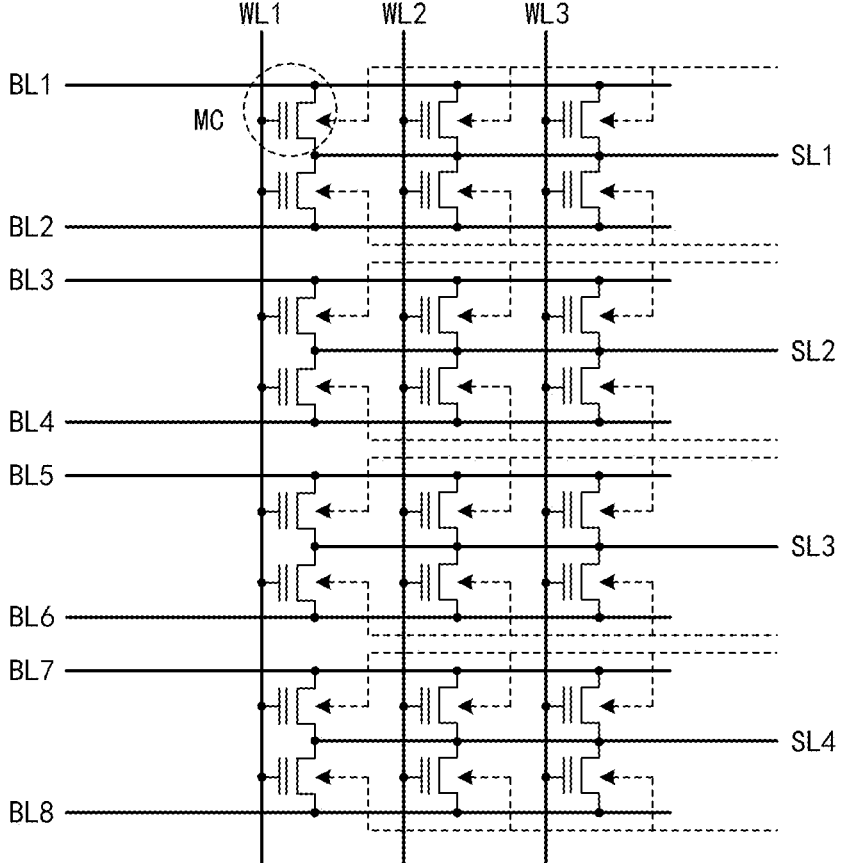
FIG. 18 schematically shows an equivalent circuit diagram of a NOR-type memory device according to an embodiment of the present disclosure.

FIG. 18 schematically shows an equivalent circuit diagram of a NOR-type memory device according to an embodiment of the present disclosure.

In an example of FIG. 18, three word lines WL1, WL2, and WL3 and eight bit lines BL1, BL2, BL3, BL4, BL5, BL6, BL7, and BL8 are schematically shown. However, specific numbers of bit lines and word lines are not limited thereto. At an intersection of the bit line and the word line, a memory cell MC is provided. Four source lines SL1, SL2, SL3, and SL4 are also shown in FIG. 18. As shown in the figure, adjacent memory cells of every two layers in the vertical direction may share the same source line connection. In addition, respective source lines may be connected to each other, so that respective memory cells MC may be connected to a common source line. In addition, FIG. 18 also schematically shows an optional bulk connection to each memory cell by dotted lines. The bulk connection of each memory cell may be electrically connected to the source line connection of the memory cell.

The extension direction of the word lines WL1 to WL3 in FIG. 18 may correspond to the extension direction of the gate stack, that is, the vertical direction relative to the substrate in the aforementioned embodiments. In this direction, adjacent bit lines are isolated from each other.

Here, two adjacent memory cells in the vertical direction are configured as: the source/drain region located between the two adjacent memory cells is electrically connected to the source line. This may reduce the number of wirings.

In the above embodiments, corresponding gate stacks are respectively formed for each stack. However, the present disclosure is not limited thereto.

FIGS. 19 to 23 show schematic diagrams of some stages in a process of manufacturing a memory device according to another embodiment of the present disclosure.

Figure 19:
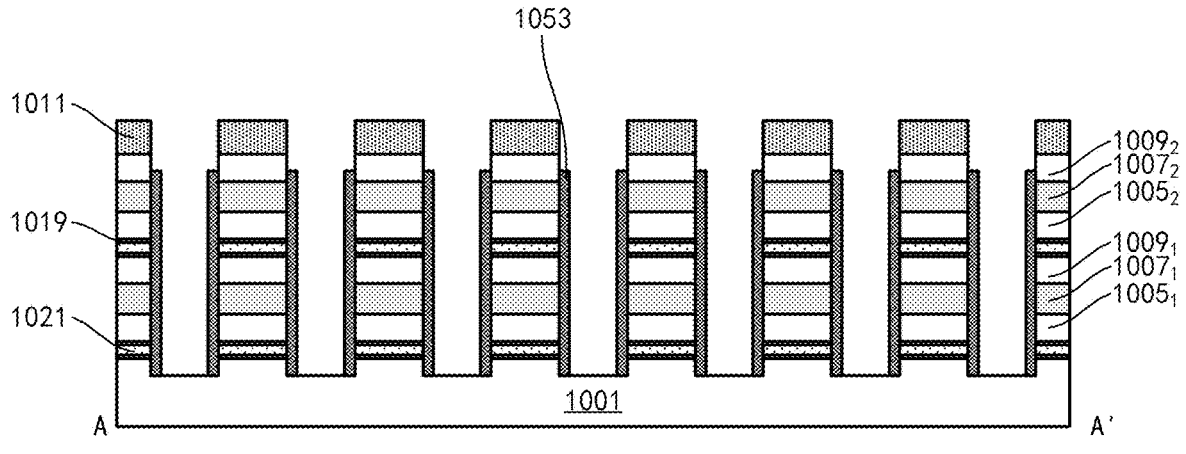
FIGS. 19 to 23 show schematic diagrams of some stages in a process of manufacturing a memory device according to another embodiment of the present disclosure.

As shown in FIG. 19, as described above in combination with FIGS. 1 to 6, a first stack S1 may be formed on the substrate 1001, and a first processing channel T1 may be formed in the first stack S1. Through the first processing channel T1, the sacrificial layer in the first stack S1 may be replaced by a conductive metal layer 1019 and an isolation layer 1021.

Unlike the above embodiments in which a first gate stack is formed in the first processing channel T1 and then a second processing channel T2 is formed, in this embodiment, after the first processing channel T1 and the second processing channel T2 are formed, a gate stack is formed in the processing channels T1 and T2 which communicate with each other.

For example, a shielding layer 1053 may be formed on the sidewall of the first processing channel T1 through the spacer formation process. The shielding layer 1053 may shield a sidewall of each semiconductor layer exposed in the first processing channel T1 in the first stack S1 (except for an upper sidewall of the second source/drain layer in the uppermost device layer in the first stack S1, crystal growth quality is improved as described above), so as to avoid subsequent growth on such sidewalls in the process of growing the seed layer. Considering the etching selectivity in subsequent processes, the shielding layer 1053 may include, for example, SiC, with a thickness of about 10 nm to 30 nm.

Figure 20:
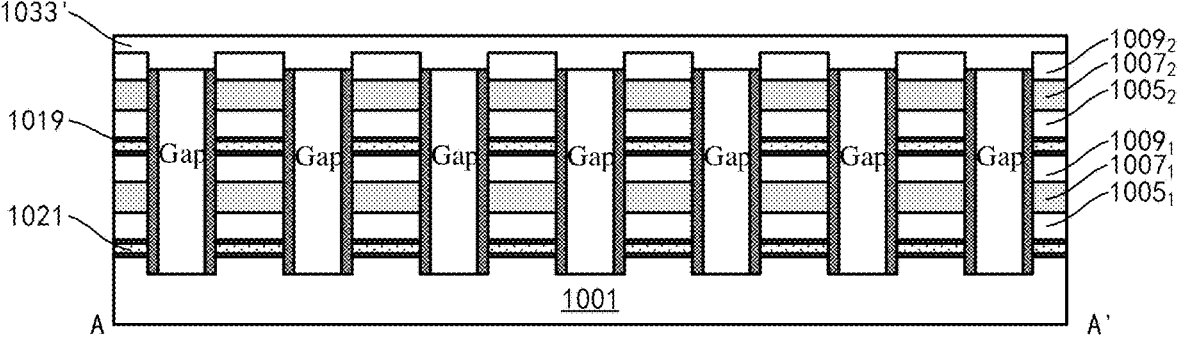

As shown in FIG. 20, the hard mask layer 1011 may be removed by selectively etching, and then a seed layer 1033' may be grown as described above in conjunction with FIG. 10. Similarly, the seed layer 1033' may be formed as a single crystal semiconductor layer that extends continuously and has a substantially planar top surface. Here, although the bottom of the first processing channel T1 is exposed and growth may be occurred, due to a relatively large aspect ratio of the first processing channel T1, the amount of growth source material entering the bottom of the first processing channel T1 is relatively small, so that a growth rate is relatively low. Moreover, even if a little material of the seed layer 1033' such as Si is grown at the bottom of the first processing channel T1, the potential impact of such growth may be avoided by increasing a depth of the first processing channel T1 into the substrate 1001 during the previous etching of the first processing channel T1. That is to say, when forming the first processing channel T1, the depth of the first processing channel T1 may be set in consideration of such a process margin.

Figure 21:
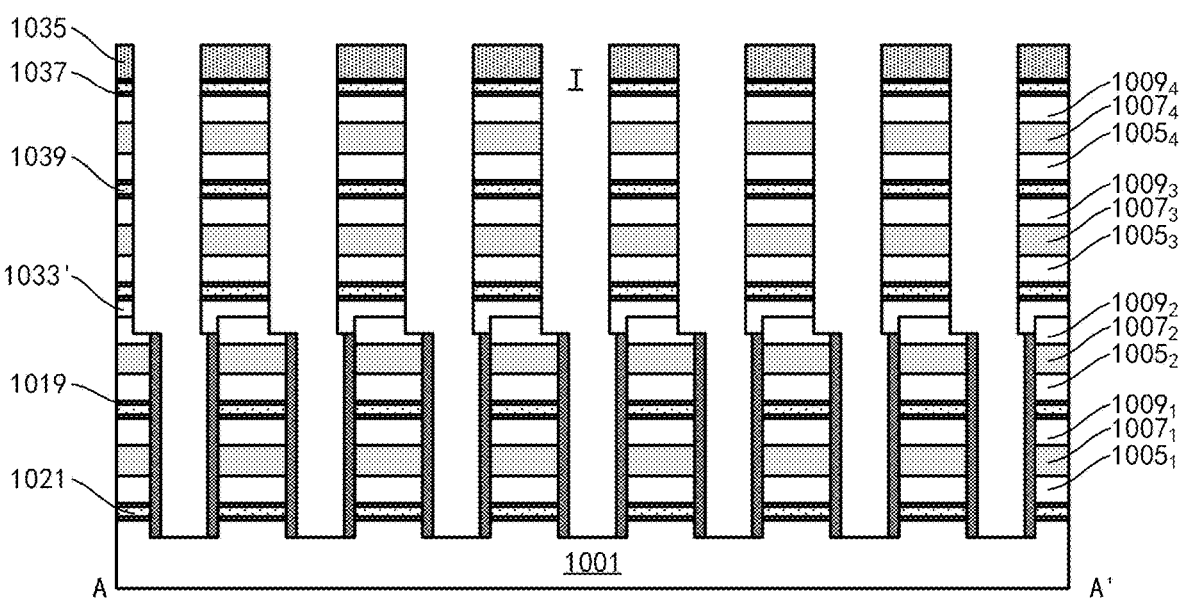

After that, as shown in FIG. 21, as described above in combination with FIGS. 11 and 12, a second stack S2 may be formed on a seed layer 1033', and a second processing channel may be formed in the second stack S2. As mentioned above, the second processing channel may communicate with the first processing channel (although there is an offset), and thus integrally shown as the processing channel T. Through the processing channel T, the sacrificial layer in the second stack S2 may be replaced by a conductive metal layer 1037 and an isolation layer 1039.

Figure 22:
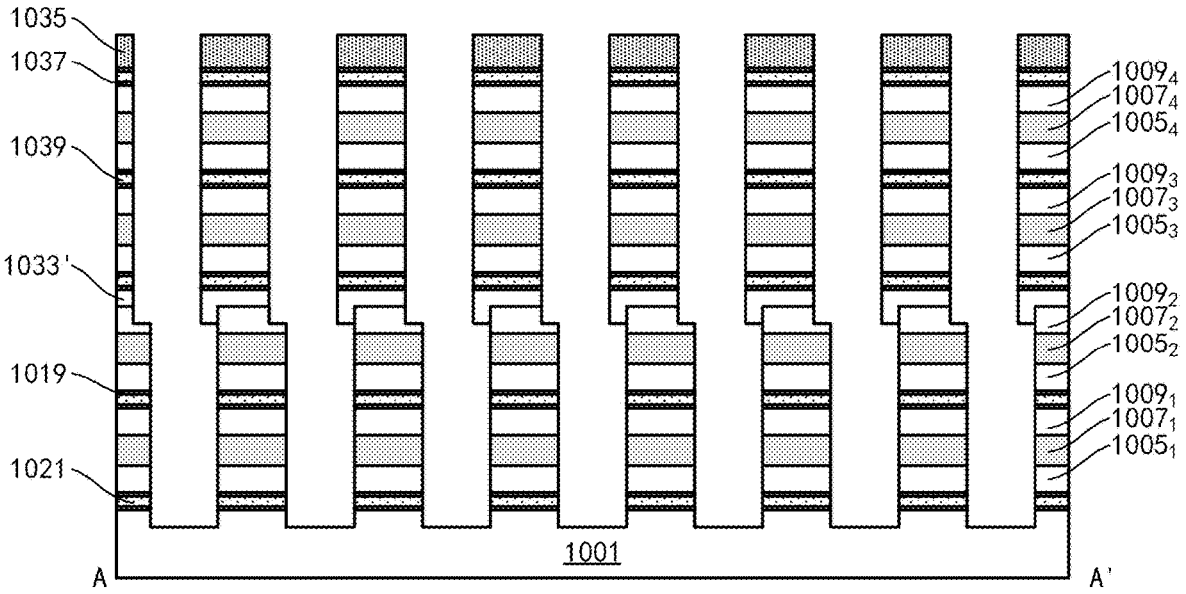
Figure 23:
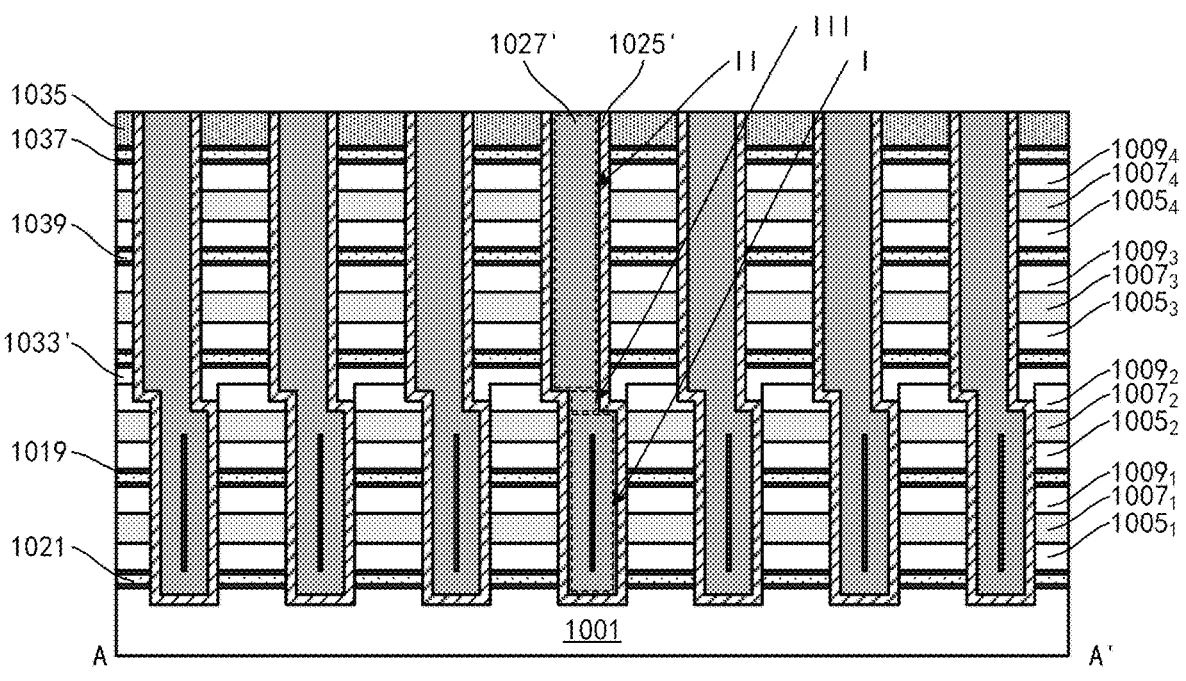

A gate stack may be formed in the processing channel T that continuously passes through the first stack S1 and the second stack S2. For example, as shown in FIG. 22, the shielding layer 1053 may be removed by selectively etching. Next, as shown in FIG. 23, a memory functional layer 1025' and a gate conductor layer 1027' may be formed in the processing channel T. Regarding the materials and formations of the memory functional layer 1025' and the gate conductor layer 1027', the above description of the first memory functional layer 1025 and the first gate conductor layer 1027 may be referred to. In this example, the memory functional layer 1025' extends along the sidewall and the bottom of the processing channel T which passes through the first stack S1 and the second stack S2, and the gate conductor layer 1027' fills an inner space of the processing channel T. In addition, gaps may exist in a lower part of the gate conductor layer 1027', especially a part in the first stack S1. Since the deposited material needs to pass through a narrowed channel between the first stack S1 and the second stack S2, which is prone to causing gaps.

Similarly, the gate conductor layer 1027' may include a first part I, a second part II above the first part I, and a connection part III between the first part I and the second part II. The connection part III may have a reduced width relative to the first part I (especially a top of the first part I) and the second part II (especially a top of the second part II). In this example, the first part I, the second part II, and the connection part III are integral with each other. As mentioned above, there may be gaps in the first part I, which may extend substantially along a vertical centerline of the first part I.

Unlike the above embodiments, a memory functional layer 1025' may continuously extend on a surface of the first part I, a surface of the second part II, and a surface of the connection part III. Therefore, in this embodiment, it is not required to separately form the protective spacer 1029 and isolation layers 1031 and 1041 in the aforementioned embodiments.

In this embodiment, an example of forming a gate stack for two adjacent stacks is described. However, the present disclosure is not limited thereto. For example, depending on a filling ability of the deposition process, the gate stack may be formed for more adjacent stacks.

According to the above embodiments, such process options are provided that for a single stack, a gate stack is formed separately; and for several adjacent stacks (two or more), a gate stack is formed together. For memory devices including a plurality of stacks, combinations of various process options may be chosen freely. For example, for some of the plurality of stacks, the gate stack may be formed separately: while for some other of the plurality of stacks, the gate stack may be formed by several adjacent layers together.

In the above embodiments, corresponding conductive metal layers are respectively formed for each layer, and then corresponding gate stacks are formed separately or together by adjacent stacks. However, the present disclosure is not limited thereto.

Figure 24:
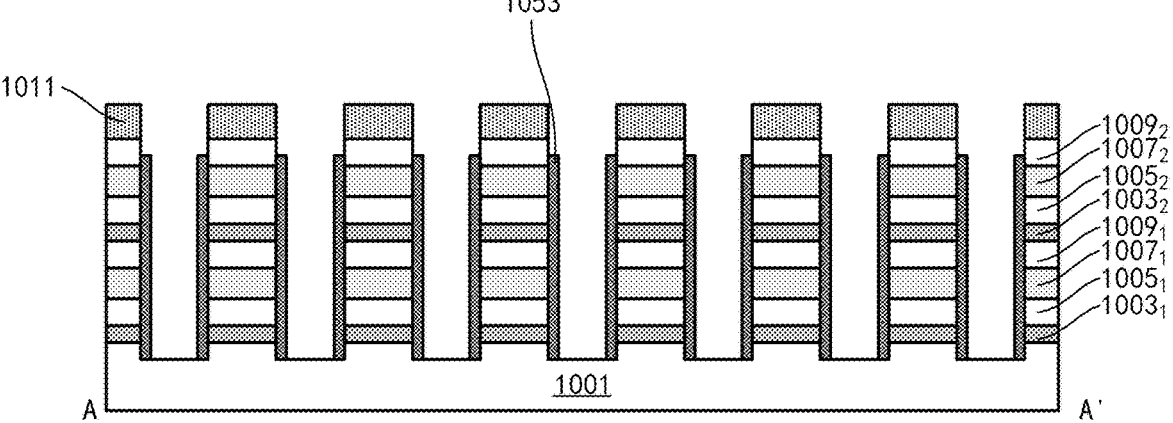
FIGS. 24 to 26 show schematic diagrams of some stages in a process of manufacturing a memory device according to another embodiment of the present disclosure.
Figure 25:
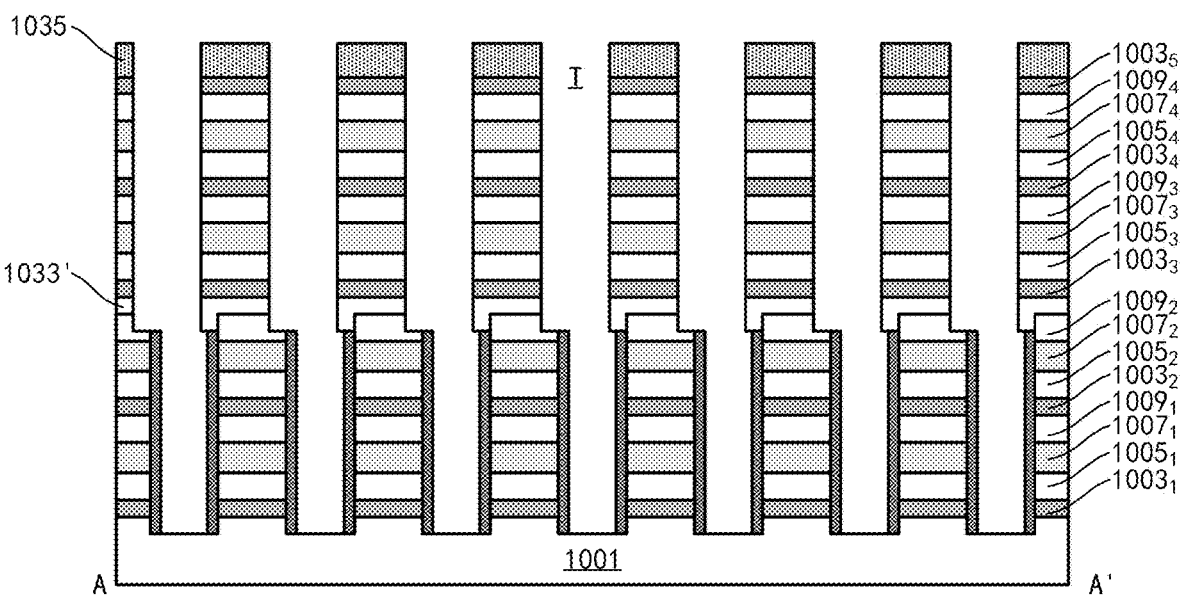
Figure 26:
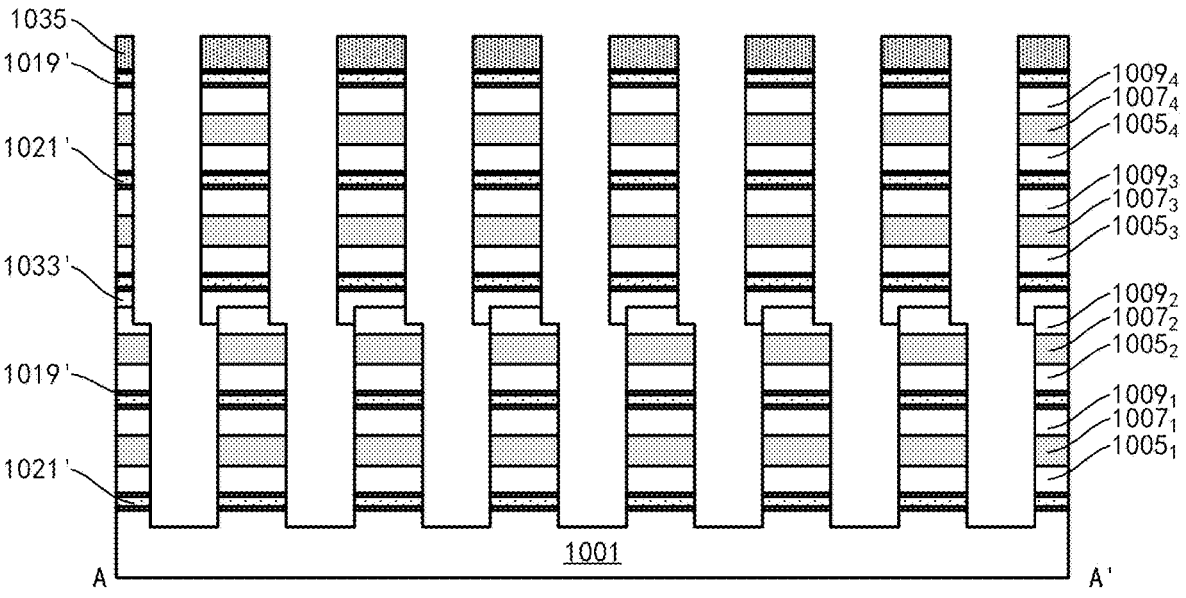

FIGS. 24 to 26 show schematic diagrams of some stages in a process of manufacturing a memory device according to another embodiment of the present disclosure.

As shown in FIG. 24, as described above in combination with FIGS. 1 to 3, a first stack S1 may be formed on the substrate 1001 and a first processing channel T1 may be formed in the first stack S1.

Unlike the above embodiments in which the sacrificial layer in the first stack S1 is replaced by the conductive metal layer 1019 and the isolation layer 1021 through the first processing channel T1, in this embodiment, a shielding layer 1053 may be formed as described in combination with FIG. 19 in a case of retaining the sacrificial layer.

After that, as described above in combination with FIGS. 20 and 21, a seed layer 1033' may be grown to form a second stack S2 on the seed layer 1033', and a second processing channel (shown together with the first processing channel as the processing channel T) may be formed in the second stack S2.

As shown in FIG. 26, the shielding layer 1053 may be removed by selectively etching. Next, through the processing channel T, the sacrificial layers in the first stack S1 and the second stack S2 may be replaced by a conductive metal layer 1019' and an isolation layer 1021'. For the formations and materials of the conductive metal layer 1019' and the isolation layer 1021', the above description of the conductive metal layer 1019 and the isolation layer 1021 may be referred to. After that, a gate stack may be formed as described above in conjunction with FIG. 23.

Thus, more process options may be provided. For example, for a plurality of stacks of the memory device, corresponding conductive metal layers and corresponding gate stacks may be respectively formed separately for some stacks of the plurality of stacks. For some other stacks of the plurality of stacks, several adjacent stacks may be formed together to form corresponding gate stacks, and the respective conductive metal layers of such several adjacent stacks may be formed separately or together.

In the above embodiments, for each device layer, conductive metal layers are formed on the upper surface and the lower surface of each device layer as bit/source line connections, so as to reduce resistance. However, according to the embodiments of the present disclosure, it is not limited thereto. For example, a conductive metal layer may be formed only on the upper surface or the lower surface of each device layer.

FIGS. 27 to 30 show schematic diagrams of some stages in a process of manufacturing a memory device according to another embodiment of the present disclosure.

Figure 27:
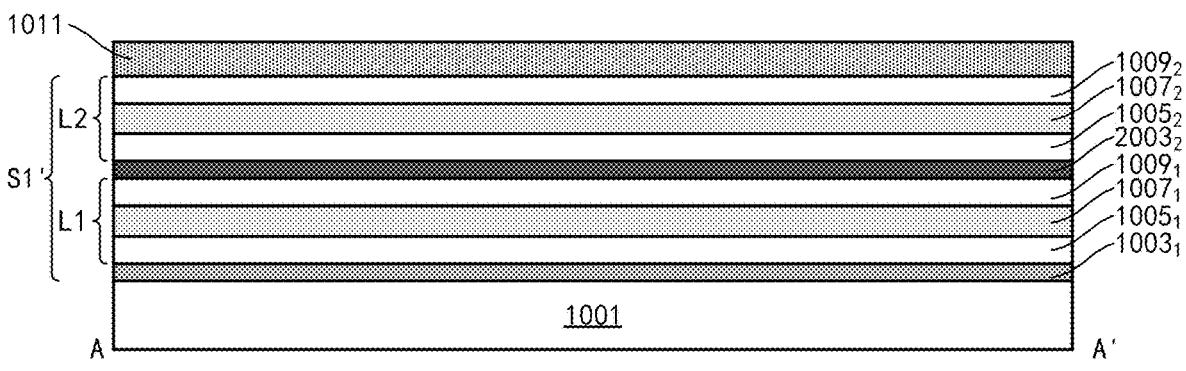
FIGS. 27 to 30 show schematic diagrams of some stages in a process of manufacturing a memory device according to another embodiment of the present disclosure, Among them, FIGS. 2(*a*) and 16 (*a*) are top views, and FIG. 2(*a*) shows a position of line AA' and a position of line BB', FIGS. 1, 2(*b*), 3 to 7, 8(*a*), 8(*b*), 9 to 15(*a*), 16(*b*) and 19 to 30 are cross-sectional views along line AA', FIG. 16(*c*) is a cross-sectional view along line BB', FIGS. 15(*b*), 15(*c*) and 15(*d*) are schematic enlarged views of different examples of part P in FIG. 15(*a*).

As shown in FIG. 27, as described above in conjunction with FIG. 1, a first stack S1 may be formed on the substrate 1001. Unlike the above embodiments, the sacrificial layer may include a first sacrificial layer $1003_1$ and a second sacrificial layer $2003_2$ with etching selectivity relative to each other, so that one of the first sacrificial layer and the second sacrificial layer is formed on the upper surface of each device layer L1 and L2, and the other one of the first sacrificial layer and the second sacrificial layer is formed on the lower surface (same as in the above embodiment, no sacrificial layer is formed on the upper surface of the uppermost device layer L2 in the first stack S1, which is in consideration of the subsequent formation of a seed layer on the upper surface of the first stack S1) of each device layer L1 and L2. For example, the first sacrificial layer and the second sacrificial layer may include SiGe with different atomic ratios of Ge, or one of the first sacrificial layer and the second sacrificial layer may include SiGe and the other one of the first sacrificial layer and the second sacrificial layer may include SiC.

Figure 28:
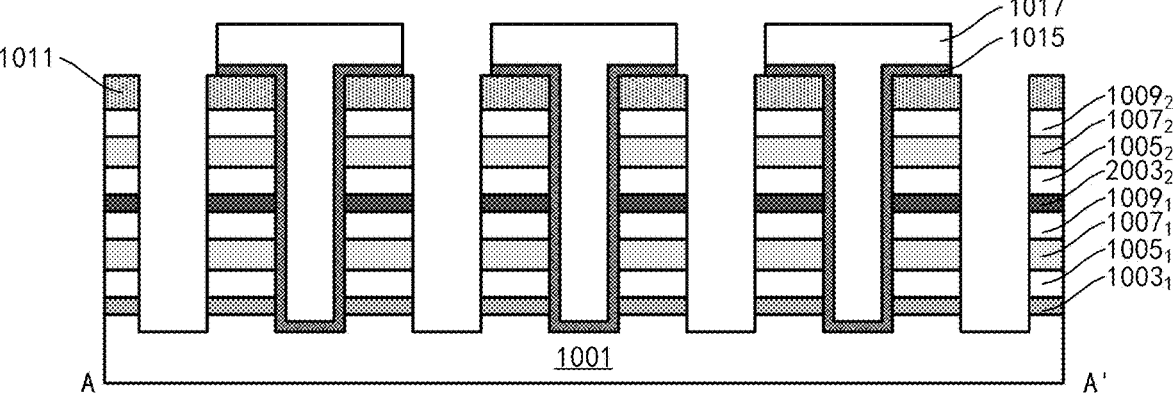

Next, as shown in FIG. 28, as described above in conjunction with FIGS. 2 to 4, a first processing channel T1 may be formed in the first stack S1 and a support layer 1015 may be formed in some of the first processing channels T1.

Figure 29:
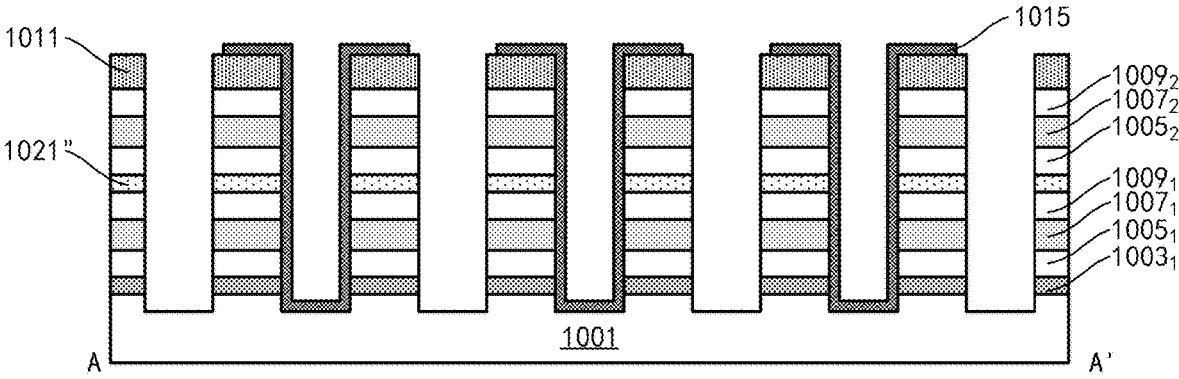

As shown in FIG. 29, a second sacrificial layer $2003_2$ may be removed by selectively etching (especially relative to the first sacrificial layer $1003_1$), and in a space released due to a removal of the second sacrificial layer $2003_2$, an isolation layer 1021" may be formed by a manner of depositing and then etching back the dielectric (such as oxide).

Figure 30:
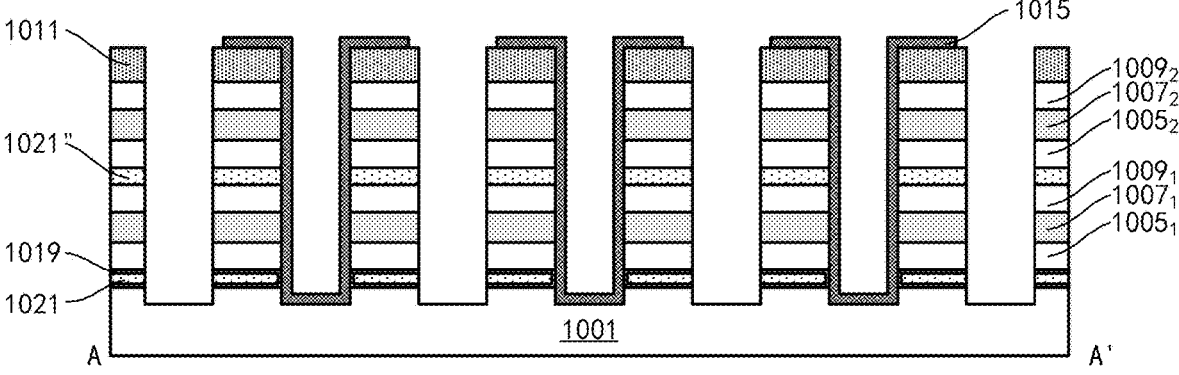

Next, as shown in FIG. 30, the first sacrificial layer $1003_1$ may be removed by selectively etching, and in a space released due to a removal of the first sacrificial layer $1003_1$, a conductive metal layer 1019 and an isolation layer 1021 may be formed as described above in conjunction with FIG. 5. Therefore, for each device layer L1 and L2, the conductive metal layer 1021 may only be formed on the upper surface of the device layer L1 and L2, or the lower surface of the device layer L1 and L2 (for the conductive metal layer of the device layer L2 will be formed on the upper surface of the subsequently formed seed layer), and on the other surface, an isolation layer 1021 or 1021" may be formed without a conductive metal layer.

The subsequent process may be performed according to the above embodiments, such as removing the support layer, etching the sidewall portion of the conductive metal layer 1021, and forming the gate stack in the processing channel, etc.

According to another embodiment, only one of the first sacrificial layer and the second sacrificial layer may be removed to form a conductive metal layer (with an isolation layer sandwiched between the conductive metal layers), while retaining the other one of the first sacrificial layer and the second sacrificial layer. For example, one of the first sacrificial layer and the second sacrificial layer may include SiGe, while the other one of the first sacrificial layer and the second sacrificial layer may include Si or a Si layer with a p-n-p doping distribution or an n-p-n doping distribution along the vertical direction (such Si layer may be electrically isolated through pn junctions).

The memory device according to embodiments of the present disclosure may be applied to various electronic devices. For example, the memory device may store various programs, applications, and data required for the operation of electronic devices. The electronic device may further include a processor cooperated with the memory device. For example, the processor may operate the electronic device by implementing programs stored in the memory device. Such electronic device includes, for example, a smart phone, a personal computer (PC), a tablet, an artificial intelligence device, a wearable device, a mobile power supply, an automotive electronic device, a communication device, or an Internet of Things (IoT) device, etc.

In the above description, the technical details such as patterning and etching of each layer are not described in detail. However, those skilled in the art should understand that various technical means may be employed to form a layer, a region or the like having a desired shape. In addition, in order to form the same structure, those skilled in the art may also design a method that is not completely the same as the method described above. In addition, although the respective embodiments are described above separately, this does not mean that the measures in the respective embodiments may not be advantageously used in combination.

The embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A memory device, comprising:
a plurality of first device layers vertically stacked on a substrate, wherein each first device layer comprises a first source/drain region disposed at a lower vertical height in the first device layer, a second source/drain region disposed at an upper vertical height in the first device layer, and a channel region between the first source/drain region and the second source/drain region;
a plurality of second device layers vertically stacked on the plurality of first device layers, wherein each second device layer comprises a third source/drain region disposed at a lower vertical height in the second device layer, a fourth source/drain region disposed at an upper vertical height in the second device layer, and a channel region between the third source/drain region and the fourth source/drain region; and
a gate stack extending vertically relative to the substrate to pass through the plurality of first device layers and the plurality of second device layers on the substrate, wherein the gate stack comprises a gate conductor layer and a memory functional layer disposed between the gate conductor layer and each device layer of the plurality of first device layers and the plurality of second device layers, and a memory cell is defined at an intersection of the gate stack and each device layer, wherein the gate stack has a surface in a bended shape at a position where the plurality of first device layers are adjacent to the plurality of second device layers.

2. The memory device of claim 1, wherein the gate conductor layer comprises a first portion extending within the first device layer and a second portion above the first portion.

3. The memory device of claim 2, wherein the bended shape is such that a region defined by a top of the first portion to partially overlaps with a region defined by a bottom of the second portion when viewed from above.

4. The memory device of claim 2, wherein the bended shape is such that a bottom of the second portion is within a region defined by a top of the first portion when viewed from above.

5. The memory device of claim 2, wherein the bended shape is such that a top of the first portion is within a region defined by a bottom of the second portion when viewed from above.

6. The memory device of claim 2, wherein a straight line along which a vertical centerline of the first portion extends does not coincide with a straight line along which a vertical centerline of the second portion extends.

7. The memory device of claim 6, wherein a lateral distance between the vertical centerline of the first portion and the vertical centerline of the second portion is greater than 2 nm.

8. The memory device of claim 2, wherein the gate conductor layer further comprises a connection portion between the first portion and the second portion, wherein the connection portion has a reduced width relative to a top of the first portion and a bottom of the second portion.

9. The memory device of claim 2, wherein the first portion of the gate conductor layer is integral with the second portion of the gate conductor layer.

10. The memory device of claim 9, wherein the first portion of the gate conductor layer has a gap extending substantially along a vertical centerline of the first portion.

11. The memory device of claim 9, wherein the memory functional layer extends continuously on a surface of the gate conductor layer.

12. The memory device of claim 2, wherein the memory functional layer comprises a first portion extending on a sidewall of the first portion of the gate conductor layer and a second portion extending on a sidewall of the second portion of the gate conductor layer, wherein the first portion of the memory functional layer is discontinuous with second portion of the memory functional layer.

13. The memory device of claim 8, further comprising: a protective spacer surrounding a periphery of the connection portion of the gate conductor layer, wherein the protective spacer has a material different from a material of the memory functional layer.

14. The memory device of claim 8, wherein the bottom of the second portion of the gate conductor layer partially overlaps with the uppermost first device layer in a vertical direction, and the memory device further comprises an isolation layer between the bottom of the second portion of the gate conductor layer and the uppermost first device layer.

15. The memory device of claim 8, wherein the top of the first portion of the gate conductor layer partially overlaps with the uppermost first device layer in a vertical direction, and the memory device further comprises an isolation layer between the top of the first portion of the gate conductor layer and the uppermost first device layer.

16. The memory device of claim 8, wherein the second portion of the gate conductor layer is integral with the connection portion, and the connection portion is in physical contact with the first portion.

17. The memory device of claim 1, further comprising:
a plurality of third device layers vertically stacked on the plurality of second device layers, wherein each third device layer comprises a fifth source/drain region disposed at a lower vertical height in the third device layer, a sixth source/drain region disposed at an upper vertical height in the third device layer, and a channel region between the fifth source/drain region and the sixth source/drain region,
wherein the gate stack further extends vertically through the plurality of third device layers,
wherein the gate stack has a surface in a bended shape at a position where the plurality of second device layers is adjacent to the plurality of third device layers.

18. The memory device of claim 1, wherein a second source/drain region in an uppermost first device layer among the plurality of first device layers is formed in a first semiconductor layer and a second semiconductor layer which are vertically stacked, and a crystal interface is provided between the first semiconductor layer and the second semiconductor layer, wherein the bended shape of the surface of the gate stack is in the uppermost first device layer.

19. The semiconductor device of claim 1, wherein a plurality of gate stacks are provided, wherein the plurality of gate stacks are arranged in an array on the substrate, and each gate stack has a substantially same bended shape.

20. The memory device of claim 1, further comprising: a conductive metal layer disposed on at least one of a lower surface and an upper surface of each device layer.

21. The memory device of claim 1, wherein each device layer comprises a single crystal semiconductor.

22. The memory device of claim 20, wherein each device layer extends in a lateral direction relative to the substrate, so as to surround a periphery of the gate stack, wherein a plurality of gate stacks are provided, the plurality of gate stacks are arranged in an array on the substrate, and each conductive metal layer extends on an upper surface or a lower surface of respective device layer so as to surround a periphery of the gate stack.

23. The memory device of claim 20, wherein the conductive metal layer is configured as a bit line connection or a source line connection.

24. A method of manufacturing a memory device, comprising:

disposing a first stack of a plurality of first device layers and a plurality of first sacrificial layers on a substrate, wherein each first device layer has a first sacrificial layer on at least a side of the first device layer;

forming a first processing channel extending vertically relative to the substrate to pass through the first stack based on a mask;

growing a seed layer continuously extending on the first stack by taking an uppermost first device layer in the first stack as a seed;

disposing a second stack of a plurality of second device layers and a plurality of second sacrificial layers on the seed layer, wherein each second device layer has a second sacrificial layer on at least a side of the second device layer;

forming a second processing channel extending vertically relative to the substrate to pass through the second stack based on the mask, wherein the second processing channel communicates with the first processing channel;

removing the first sacrificial layer through the first processing channel, and removing the second sacrificial layer through the second processing channel;

forming a first isolation layer in a space released due to a removal of the first sacrificial layer, through the first processing channel; and forming a second isolation layer in a space released due to a removal of the second sacrificial layer, through the second processing channel; and forming a first gate stack in the first processing channel, wherein the first gate stack comprises a first gate conductor layer and a first memory functional layer disposed between the first gate conductor layer and the first device layer; and forming a second gate stack in the second processing channel, wherein the second gate stack comprises a second gate conductor layer and a second memory functional layer disposed between the second gate conductor layer and the second device layer.

25. The method of claim 24, wherein before growing the seed layer, the first sacrificial layer is removed and the first isolation layer is formed in the space released due to the removal of the first sacrificial layer.

26. The method of claim 25, wherein after forming the first isolation layer and before growing the seed layer, the first gate stack is formed in the first processing channel.

27. The method of claim 26, wherein the first gate stack is formed such that a top of the first gate stack is concave relative to a top of the uppermost first device layer, and the method further comprises:

forming a protective spacer on a sidewall of the first processing channel.

28. The method of claim 26, wherein the first gate stack is formed such that a top of the first gate conductor layer is concave relative to a top of the uppermost first device layer, and a top of the first memory functional layer is substantially flush with the top of the uppermost first device layer.

29. The method of claim 27, further comprising:

forming an isolation layer in the first processing channel, so as to shield the top of the first gate stack, wherein after forming the second processing channel, the method further comprises: selectively etching the isolation layer through the second processing channel, so as to form an opening in the isolation layer, such that the second processing channel communicates with the first processing channel.

30. The method of claim 25, wherein after forming the first isolation layer and before growing the seed layer, the method further comprises: forming a shielding layer on a sidewall of the first processing channel, with a top of the shielding layer being concave relative to a top of the uppermost first device layer, wherein after forming the second isolation layer through the second processing channel, the method further comprises:

removing the shielding layer;

forming a memory functional layer and a gate conductor layer in the first processing channel and the second processing channel which communicate with each other, wherein the memory functional layer comprises the first memory functional layer and the second memory functional layer, and the gate conductor layer comprises the first gate conductor layer and the second gate conductor layer.

31. The method of claim 24, wherein after forming the first processing channel and before growing the seed layer, the method further comprises: forming a shielding layer on a sidewall of the first processing channel, with a top of the shielding layer being concave relative to a top of the uppermost first device layer, wherein the method further comprises:

removing the shielding layer;

removing the first sacrificial layer and the second sacrificial layer through the first processing channel and the second processing channel which communicate each other, forming the first isolation layer in the space released due to the removal of the first sacrificial layer, and forming the second isolation layer in the space released due to the removal of the second sacrificial layer; and forming a memory functional layer and a gate conductor layer in the first processing channel and the second processing channel which communicate each other, wherein the memory functional layer comprises the first memory functional layer and the second memory functional layer, and the gate conductor layer comprises the first gate conductor layer and the second gate conductor layer.

32. The method of claim 24, wherein, in an operation of forming the first isolation layer through the first processing channel, the method further comprises: forming a first conductive metal layer on a lower surface and/or an upper surface of each first device layer exposed due to the removal of the first sacrificial layer, wherein the first conductive metal layers are electrically isolated by the first isolation layer, in an operation of forming the second isolation layer through the second processing channel, further comprising: forming a second conductive metal layer on a lower surface of each second device layer and/or an upper surface of each second device layer exposed due to the removal of the second sacrificial layer, wherein the second conductive metal layers are electrically isolated by the second isolation layer.

33. The method of claim 32, wherein removing the first sacrificial layer through the first processing channel and removing the second sacrificial layer through the second processing channel, comprises:

forming a support layer in some of respective processing channels of the first processing channels and the second processing channels; and removing, through the rest of the respective processing channels, respective sacrificial layers of the first sacrificial layers and the second sacrificial layers by selectively etching, wherein forming the first conductive metal layer and the first isolation layer through the first processing channel and forming the second conductive metal layer and the second isolation layer through the second processing channel, comprise:

forming, through the rest of the respective processing channels, a conductive metal material in a substantially conformal manner;

filling, through the rest of the respective processing channels, a dielectric material;

etching back the dielectric material and the conductive metal material, such that the dielectric material and the conductive metal material are left in the space, wherein the etched-back dielectric material forms a respective isolation layer of the first isolation layer and the second isolation layer;

removing the support layer from the some of the respective processing channels and forming a shielding layer in the rest of the respective processing channels;

etching a portion of the conductive metal material extending on a sidewall of the dielectric material through the some of the respective processing channels, wherein the etched conductive metal material forms a respective conductive metal layer of the first conductive metal layer and the second conductive metal layer; and removing the shielding layer.

34. An electronic device, comprising a memory device of claim 1.

35. The electronic device of claim 34, wherein the electronic device comprises a smart phone, a personal computer, a tablet, an artificial intelligence device, a wearable device, a mobile power supply, an automotive electronic device, a communication device, or an Internet of Things device.

*     *     *     *     *